(12) United States Patent
Zhou et al.

(10) Patent No.: US 7,542,188 B2
(45) Date of Patent: Jun. 2, 2009

(54) OPTICAL SCANNING USING VIBRATORY DIFFRACTION GRATINGS

(75) Inventors: Guangya Zhou, Singapore (SG); Logeeswaran Vj, Melaka (MY); Fook Siong Chau, Singapore (SG)

(73) Assignee: National University of Singapore, Singapore (SG)

( * ) Notice: Subject to any disclaimer, the term of this patent is extended or adjusted under 35 U.S.C. 154(b) by 47 days.

(21) Appl. No.: 11/019,519

(22) Filed: Dec. 23, 2004

(65) Prior Publication Data

US 2005/0156481 A1 Jul. 21, 2005

Related U.S. Application Data

(60) Provisional application No. 60/537,249, filed on Jan. 20, 2004.

(51) Int. Cl.
*G02B 26/10* (2006.01)
*G02B 26/08* (2006.01)
*H02N 1/00* (2006.01)

(52) U.S. Cl. .............. 359/199; 348/205; 310/309; 359/198

(58) Field of Classification Search ........... 310/309; 359/569, 573, 197–199, 223–226; 348/203–205
See application file for complete search history.

(56) References Cited

U.S. PATENT DOCUMENTS

| | | | |
|---|---|---|---|
| 3,721,486 A | 3/1973 | Bramley | |
| 3,721,487 A | 3/1973 | Pieuchard et al. | |
| 3,795,768 A | 3/1974 | Locke | |
| 3,940,202 A | 2/1976 | Kato et al. | |
| 3,953,105 A | 4/1976 | Ih | |
| 4,067,639 A | 1/1978 | Kramer | |
| 4,094,575 A | 6/1978 | Kellie | |
| 4,094,576 A | 6/1978 | Heiling | |
| 4,106,844 A | 8/1978 | Bryngdahl et al. | |
| 4,113,343 A | 9/1978 | Pole et al. | |
| 4,121,882 A | 10/1978 | White | |
| 4,133,600 A | 1/1979 | Russell et al. | |
| 4,239,236 A | 12/1980 | Kramer | |
| 4,243,293 A | 1/1981 | Kramer | |
| 5,025,346 A * | 6/1991 | Tang et al. | 361/283.1 |
| 5,635,640 A * | 6/1997 | Geen | 73/504.12 |

(Continued)

OTHER PUBLICATIONS

Yasseen et al., "Diffraction Grating Scanners Using Polysilicon Micromotors", IEEE Journal of Selected Topics in Quantum Electronics, vol. 5, No. 1, Jan./Feb. 1999, pp. 75-82.

*Primary Examiner*—Burton Mullins
(74) *Attorney, Agent, or Firm*—Birch, Stewart, Kolasch & Birch, LLP

(57) ABSTRACT

An optical scanning apparatus includes an in-plane vibratory mass platform having at least one diffraction grating formed thereon as the scanning element, at least one flexure structure that connects the mass platform to at least one fixed support, and at least one driving actuator that drives the mass platform into an in-plane vibratory motion which can be rotational and/or translational. The apparatus may also be formed by a mass platform having at least one diffraction grating formed thereon as the scanning element, at least one driving actuator connected to the mass platform through at least one flexure structure. The driving actuator drives the mass platform into an in-plane vibratory motion.

23 Claims, 18 Drawing Sheets

U.S. PATENT DOCUMENTS

| | | | |
|---|---|---|---|
| 5,650,568 A * | 7/1997 | Greiff et al. | 73/504.09 |
| 5,986,381 A * | 11/1999 | Hoen et al. | 310/309 |
| 6,137,206 A * | 10/2000 | Hill | 310/306 |
| 6,198,145 B1 * | 3/2001 | Ferrari et al. | 257/415 |
| 6,275,320 B1 * | 8/2001 | Dhuler et al. | 359/237 |
| 6,329,738 B1 * | 12/2001 | Hung et al. | 310/309 |
| 6,333,584 B1 * | 12/2001 | Jerman et al. | 310/309 |
| 6,360,035 B1 * | 3/2002 | Hurst et al. | 385/18 |
| 6,497,141 B1 | 12/2002 | Turner et al. | |
| 6,545,385 B2 * | 4/2003 | Miller et al. | 310/309 |
| 6,546,801 B2 * | 4/2003 | Orsier et al. | 73/514.38 |
| 6,561,028 B1 * | 5/2003 | Aigner et al. | 73/504.11 |
| 6,563,249 B1 * | 5/2003 | Jung et al. | 310/309 |
| 6,593,677 B2 | 7/2003 | Behin et al. | |
| 6,657,360 B2 * | 12/2003 | Jerman et al. | 310/309 |
| 6,664,706 B1 * | 12/2003 | Hung et al. | 310/309 |
| 6,686,639 B1 | 2/2004 | Tsai | |
| 6,735,004 B1 * | 5/2004 | Hagelin et al. | 359/198 |
| 6,891,615 B2 * | 5/2005 | Koike et al. | 356/328 |
| 6,894,836 B2 * | 5/2005 | Christenson | 359/563 |
| 6,963,679 B1 * | 11/2005 | Novotny et al. | 385/18 |
| 6,975,459 B2 * | 12/2005 | Barbastathis et al. | 359/573 |
| 6,998,758 B2 * | 2/2006 | Aksyuk et al. | 310/309 |
| 7,027,152 B2 | 4/2006 | Schenk et al. | |
| 7,099,084 B2 * | 8/2006 | Bi | 359/565 |
| 7,126,250 B2 * | 10/2006 | Greywall et al. | 310/309 |
| 2002/0054415 A1 | 5/2002 | Lee | |
| 2003/0057350 A1 * | 3/2003 | Miller et al. | 248/664 |
| 2003/0215183 A1 * | 11/2003 | Wildnauer et al. | 385/37 |

* cited by examiner

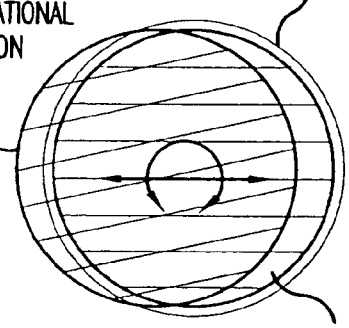
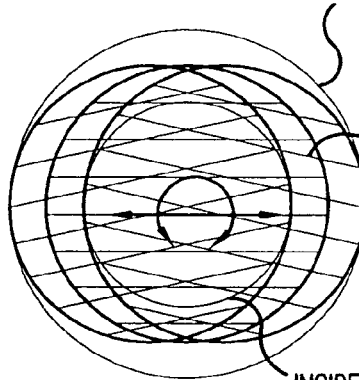
FIG.8A  FIG.8B
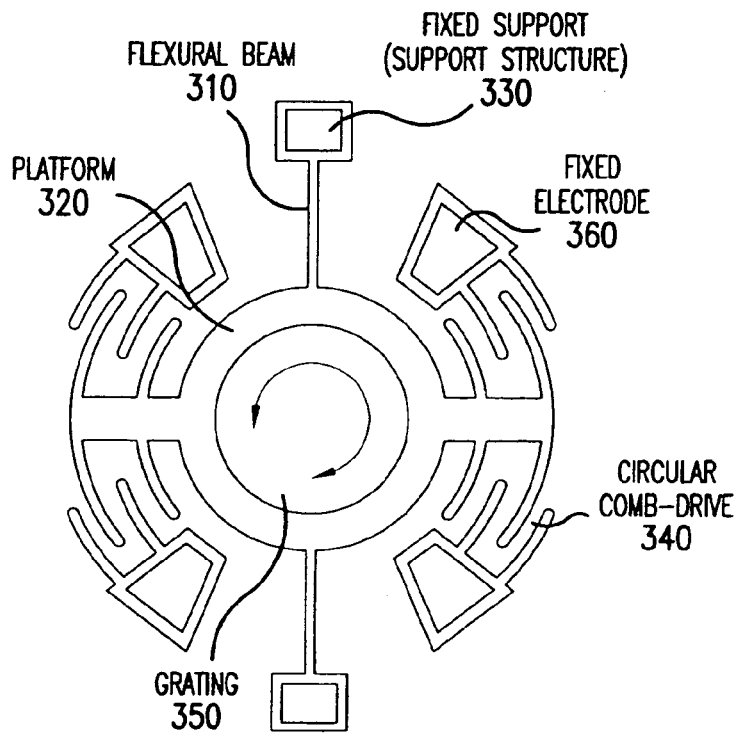
FIG.9

OPTICAL SCANNING USING VIBRATORY DIFFRACTION GRATINGS

This application claims the benefit of the U.S. Provisional Application No. 60/537,249, filed on Jan. 20, 2004 which is hereby incorporated by reference.

BACKGROUND OF THE INVENTION

1. Field of the Invention

The invention relates to an optical scanning system using a vibratory or oscillatory diffractive element made by micromachined or Micro-Electro-Mechanical (MEM) technology.

2. Discussion of the Related Art

Optical scanning devices have numerous applications in the following fields: manufacturing, medicine, military hardware, information systems and communications. These applications include but not limited to optical switching, biomedical imaging (optical coherence tomography, scanning laser confocal microscopy etc.), laser printing, spectrometer, microdisplays, image projection and acquisition, laser materials processing (marking, drilling, coding trimming etc.), and stereolithography.

The primary function of an optical scanner device is to steer an electromagnetic beam, typically visible light (wavelength from 400 nm to 700 nm) along a single or multiple axes. For all the application fields, the basic requirements for a high-end good performance scanner are a large scan angle and a high operating frequency, resonant or non-resonant. There are many scanning methods to achieve these, among them are holographic, polygonal, galvanometric, resonant, acousto-optic, and electro-optic techniques. The electro-optic and acousto-optic scanners have a high operating frequency in the MHz range but with an inherent small scan angle of about 4 degrees. The other scanners, which are mainly mechanical in nature, have a larger scan angle of about 30 degrees but are limited to a low operating frequency in the range of 200 to 10,000 Hz.

All of the above existing optical scanners until now have been conventionally manufactured. Recently a new group of scanners have emerged that are fabricated using the microfabrication techniques similar to the microelectronics circuit. These micromachined optical scanners have attracted much attention because of their outstanding advantages compared to conventional macro-scanners. These advantages include having a small mass leading to a high resonant frequency, compact small size, low power consumption, ease of integrating with CMOS circuitry, light weight and low per unit cost due to batch fabrication. These benefits will not only provide performance enhancements such as smaller, high-speed, and lower-cost to existing applications but also form the technological basis for a wide range of new applications in raster-scanning retinal projections and compact high-speed fiber optic components.

The related art microscanners differ in their mechanical structure (topology), operating principle, and actuation mechanism. The related art microscanners include, for example, electrostatic, electromagnetic, electrothermal, piezoelectric, and magnetostrictive types. However, all share a common scanning technology platform that is based on micromirror reflection technology and are actuated out-of-plane. One of the critical drawbacks of this micromirror reflection technology is large dynamic mirror deformation (greater than $\lambda/8$ mechanical). This phenomenon is due to the fabrication-limited thickness and high out-of-plane acceleration forces, which cause the mirror plate to deform dynamically during scanning, thus adversely affecting the optical resolution.

The related art micromirror reflection technology can be represented in a generic schematic, as shown in FIG. 3. The micromirror 60 can be made to rotate about an axis defined by two torsional beams 70 through the driving actuator 80. One of the most prominent problems of the scanning micromirror entails the dynamic deformation of the mirror plate. Micromachined mirrors are normally much thinner than conventional macro-scanning mirrors, therefore, at high scanning frequencies, micromachined mirrors deform dynamically, which introduces time-dependent optical aberrations and severely limits the optical resolution.

The optical resolution is defined as the ratio of the mirror scan angle and optical beam divergence (or as the ratio of the length of scan line to the spot size). There are many factors that will affect the optical resolution of a micromachined scanner, for example, beam diffraction, static and dynamic deformation of the micromirror. The static deformation of a micromirror, which is normally caused by the residual stress of the mirror material, can be minimized to a significant degree by introducing mirror curvature compensation optics to the scanner. However, the reduction of scanning beam divergence caused by beam diffraction and micromirror's dynamic deformation is still a big challenge for high-speed scanning micromirror developers. Both diffraction and dynamic deformation are dependent on the mirror size; increasing the mirror size decreases diffraction, while simultaneously increasing the dynamic deformation. Some researchers have used a thick micromirror to achieve a dynamic deformation within the Rayleigh limit ($\lambda/8$ mechanical). However, increasing the mirror thickness also increases the mass, and in order to maintain a high scanning frequency, the stiffness of the mirror suspension has to be increased. This results in a very high driving voltage and considerable power consumption.

The only current exception to the micromirror reflection technology that exists in the literature is a diffraction grating scanner using a polysilicon micromotor (as shown in FIG. 4), which is a direct miniaturized version of rotating holographic laser beam scanner. However, this miniaturized scanner has some critical drawbacks. Firstly, the scanning rate is severely limited to a few hundred Hz since the polysilicon micromotor shown in FIG. 4 lacks the potential to spin at a high speed. Secondly, the driving voltage required for motion to be continuous is very large, typically hundreds of volts. Thirdly, the scanner is not free from wear and tear especially when high spinning speed is required, thus severely limiting the lifetime of the scanner.

As discussed above, the design of existing microscanners based on micromirrors and micromotors has been mostly focused on the use of existing fabrication technologies, device designs and architecture without giving sufficient attention to the optical performance of these devices, particularly their performance under dynamic conditions. These limitations of the related art micromachined scanners prevent their successful use in many applications, hence creating a technological trade-off in deriving some obvious advantages of miniaturization but without the accompanying performance benefits of high scanning resolution.

The disadvantages of the conventional micromirror scanners include dynamic deformation: the inability to provide for an optically flat mirror surfaces during scanning such that reflective surfaces are free of phase distortion which will keep the system in optical focus. An additional disadvantage of the conventional micromirror scanners includes high power: the inability to reduce the actuation voltages and operate linearly for large angle of scan.

The disadvantages of micromotor scanners include low scanning rate, which is the inability to provide for a high scan frequency, in the order of tens of kHz. An additional disadvantage is high power consumption arising from the inability to reduce actuation voltages. A further disadvantage arises from a reduced lifetime arising from the inability to operate for an extended period of time due to wear and tear.

As has been shown, there are serious disadvantages that hamper the wide application of conventional vibratory or oscillatory micromirror and micromotor scanners.

SUMMARY OF THE INVENTION

Accordingly, the invention is directed to a micro-electro-mechanical (MEM) structure that substantially obviates one or more of problems due to limitations and disadvantages of the related art.

An object of the invention is to provide a micromachined vibratory or oscillatory diffraction grating capable of in-plane rotational and/or translational motion. However, the diffraction grating itself need not be confined to execute an ideal in-plane motion, as for some preferred embodiments, this combined in-plane and out-of-plane motion can be utilized for multi-dimensional scanning without jeopardizing the performance.

An object of the invention is to provide a micromachined vibratory or oscillatory diffraction grating capable of in-plane rotational and/or translational motion that upon given an incident electromagnetic beam of any wavelength coupled with the mechanical motion will cause the diffracted beams to scan accordingly.

An object of the invention is to provide a micromachined vibratory or oscillatory diffraction grating capable of in-plane rotational and/or translational motion in combination with out-of-plane rotational and/or translational motion for multi-dimensional scanning. In the invention, the mass platform can be driven in an in-plane motion that is at least one of rotational or translational motion, and the in-plane motion is combined with out-of-plane motion that is at least one of rotational or translational motion. Also, the mass platform can be driven in an in-plane motion that is at least one of rotational or translational motion, the in-plane motion being in combination with out-of-plane motion that is at least one of rotational or translational motions, and the structure is used for multi-dimensional scanning.

An object of the invention is to provide a diffraction grating scanner having a wider optical scan angle and high resonant frequencies leading to high scan frequencies. The inventive grating scanners have low operating voltages and produce a low dynamic mirror deformation (less than λ/8 mechanical), resulting in enhanced optical resolution.

The invention, in part, pertains to a mechanical structure that includes a mass platform, at least one fixed support connected to the mass platform through at least one flexure structure (flexure suspension), and at least one driving actuator. The mass platform can be of any geometric shape and can contain at least one diffraction grating. The flexure structure can be of any geometric topology while the fixed support forms a fixed reference point during the excited motion of the mass platform. The flexure structure and driving actuator need not be formed on the same substrate and their center-of-mass need not be confined to lie on the same plane. The diffraction grating can be orientated at any angle with respect to the mass platform. The driving actuator can be connected to the mass platform, or the flexure structure, or both. The excitation force (or displacement) produced by the drive actuator can be applied directly on the mass platform, or on the flexure structure, or both. The driving actuator can be a direct power drive mechanism using electromagnetic, piezoelectric, electrostatic, optical, and electrothermal or any other energy conversion drive. The driving actuator drives the mass platform into an in-plane vibratory motion which can be rotational and/or translational.

The invention, in part, pertains to a mechanical structure that includes a mass platform, at least one driving actuator connected to the mass platform through at least one flexure structure. The mass platform can be of any geometric shape and can contain at least one diffraction grating, and the flexure structure can be of any geometric topology. The diffraction grating can be orientated at any angle with respect to the mass platform. The driving actuator drives the mass platform in an in-plane vibratory or oscillatory motion which can be rotational and/or translational.

The invention, in part, pertains to a mechanical structure that includes a mass platform, and at least one driving actuator connected to the mass platform through at least one flexure structure. The driving actuator can be composed of at least one spring-mass system. The term "primary system" refers to the driving actuator spring-mass system. The term "secondary system" refers to the mass platform and the flexure suspension that connects the mass platform to the driving actuators.

The invention, in part, pertains to vibratory mechanical structure having a mass platform, at least one support structure connected to the mass platform through at least one flexural structure, at least one planar diffraction grating patterned on the mass platform, and at least one driving actuator. The actuator can be an electrostatic comb drive that includes an interdigitated finger structure having fixed fingers and movable fingers, and the movable fingers connect to the mass platform while the fixed fingers include a fixed electrode connected to a substrate. The mass platform can contain a diffraction grating, and the comb drive can be a circular comb drive. The vibratory structure can further contain a folded beam suspension connected to the support structure wherein the folded beam suspension is connected to a substrate. The flexural structure can be a first flexural structure connected to the mass platform, and the first flexural structure transversely connects to a second flexural structure, and the second flexural structure has two ends that are connected to the support structure.

The invention, in part, pertains to a vibratory-mechanical structure that includes a mass platform, a first support connected to the mass platform through a first flexural beam, a second support connected to the mass platform through a second flexural beam, the second support and second flexural beam attaching to the mass platform at a 180° angle to the first support and first flexural beam, a first comb drive attached to the mass platform at a 90° angle from the first support and flexural beam, and a second comb drive attached to the mass platform at a 270° angle from the first support and flexural beam. Each comb drive can have an interdigitated finger structure having fixed fingers and movable fingers, and the movable fingers of each comb drive connect to the mass platform while the fixed fingers of each comb drive are a fixed electrode connected to a substrate. The mass platform can contain a diffraction grating, and the mass platform can be circular. Each comb drive can be a circular comb drive.

The invention, in part, pertains to a vibratory-mechanical structure that includes a mass platform, a support connected to the mass platform through a flexural beam, and an electrostatic drive having a movable electrode formed on the flexural beam and at least one fixed electrode attached to a substrate. The electro-static drive can be a comb drive with an interdigitated finger structure having fixed fingers attached to the fixed electrode and movable fingers attached to the flexural beam, and the fingers are at a right angle to the flexural beam. The mass platform can be circular or square.

The invention, in part, pertains to a vibratory-mechanical structure that includes a mass platform and a comb drive resonator connected to the mass platform through a flexural beam. The comb drive resonator includes a support structure attached to the flexural beam, a folded beam suspension attached to the support structure, and first and second comb drives attached to opposite ends of the support structure. In the invention, the support structure attaches to the flexural beam at a right angle, the folded beam suspension has flexure elements aligned parallel to the flexural beam, and the folded beam suspension is fixed to a substrate.

The invention, in part, pertains to a vibratory-mechanical structure that includes a mass platform and a parallel-plate electrostatic actuator connected to the mass platform through a flexural beam. The parallel-plate electrostatic actuator includes a support structure attached to the flexural beam, a folded beam suspension attached to the support structure, and first and second parallel-plate actuators attached to opposite ends of the support structure. Each parallel plate actuator can be fixed to a substrate, and the support structure attaches to the flexural beam at a right angle. Also, the folded beam suspension can have flexure elements aligned parallel to the flexural beam, and the folded beam suspension can be fixed to a substrate.

The invention, in part, pertains to a vibratory-mechanical structure that includes a mass platform, a first comb drive resonator connected to the mass platform through a first flexural suspension, and a second comb drive resonator connected to the mass platform through a second flexural suspension, wherein the second flexural suspension is connected to the mass platform at a 180° angle to the first flexural suspension. Each comb drive resonator can include a support structure attached to the mass platform using a flexural suspension, and the flexural suspension includes the flexural beam and a transverse beam placed in a T-like pattern, a folded beam suspension attached to the support structure, and first and second comb drives attached to opposite ends of the support structure. Each suspension can have two sub-suspensions, each sub-suspension having beams parallel to the flexural beam, and each subs-suspension being fixed to a substrate.

The invention, in part, pertains to a vibratory-mechanical structure that includes a mass platform, a first comb drive resonator connected to the mass platform through a first flexural suspension, a second comb drive resonator connected to the mass platform through a second flexural suspension, wherein the second flexural suspension is connected to the mass platform at a 120° angle to the first flexural suspension, and a third comb drive resonator connected to the mass platform through a third flexural suspension, wherein the third flexural suspension is connected to the platform at a 240° angle to the first flexural suspension.

The invention, in part, pertains to a method for forming a vibratory-mechanical diffraction grating that includes providing a silicon-on-insulator wafer, forming a photoresist layer over the wafer, forming a grating pattern in the photoresist using lithography, transferring the grating pattern to the wafer using RIE, forming a second layer of photoresist over the wafer, forming a first pattern in the photoresist followed by DRIE etching, forming a second patterned under the wafer followed by DRIE etching, and etching exposed SiO$_2$ to release the grating's structure. The first pattern can include a mass platform, suspension flexurals, support structures and driving actuators. The silicon-on-insulator wafer can include a handle wafer of 450-600 μm thickness, an oxide thickness of 0.2-2.0 μm, and a device layer of 10-50 μm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention.

FIGS. 8A and 8B illustrate why a pure angular vibration around the geometrical center of the grating is preferred for the miniaturized vibratory diffraction grating scanner.

FIG. 9 shows a plan view of a second embodiment of the MEM structure of the invention.

DETAILED DESCRIPTION

Advantages of the invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 1:
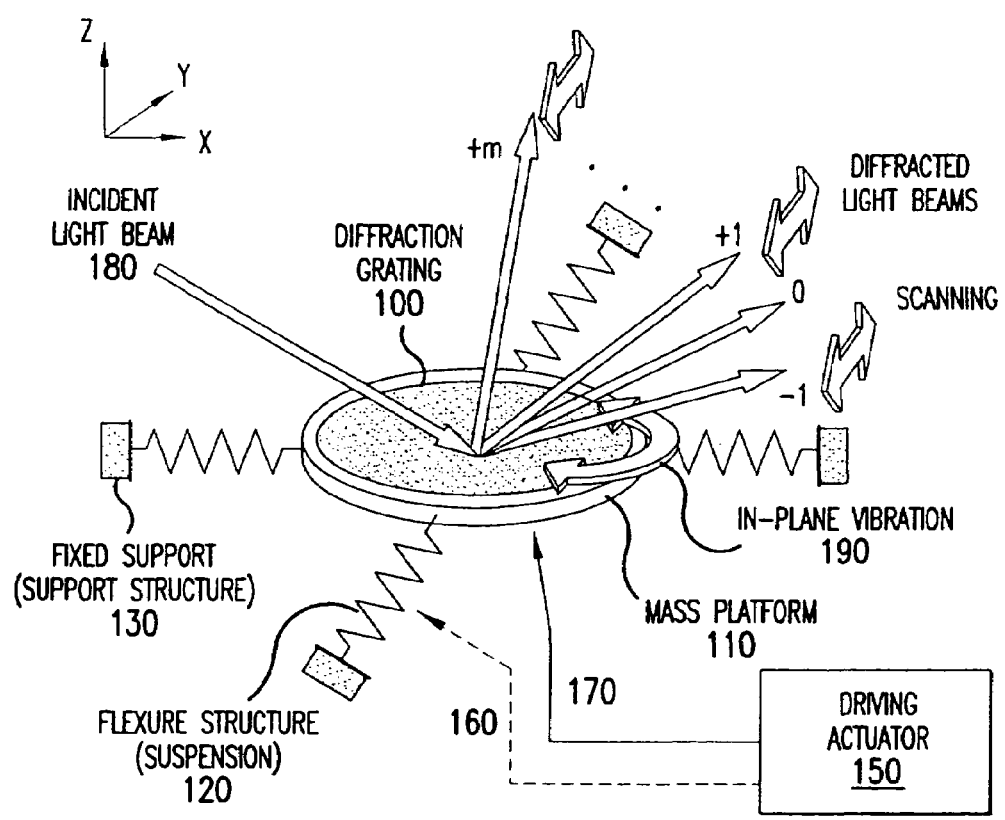
FIG. 1 schematically illustrates an optical scanner using a vibrating diffraction grating with fixed support.

FIG. 1 shows a Micro-Electro-Mechanical (MEM) structure that includes at least one diffraction grating 100, a mass platform 110, at least one flexure structure 120, at least one fixed support 130, and at least one driving actuator 150. The diffraction grating 100 is formed on the mass platform 110 that is connected through the flexure structure 120 to the fixed support 130. The fixed support 130 is fixed. The MEM structure is driven by at least one actuator 150 to perform an in-plane rotational and/or translation vibration 190. Typically, the MEM structure is operated at mechanical resonance to take advantage of the resonant amplitude magnification. The resonant frequency is tunable by varying the mass platform and stiffness of the flexure structure. The excitation force (or displacement) produced by the actuator can be applied directly on the flexure structure 120 (indicated as 160 in FIG. 1), or on the mass platform 110 (indicated as 170 in FIG. 1), or both.

Figure 2A:
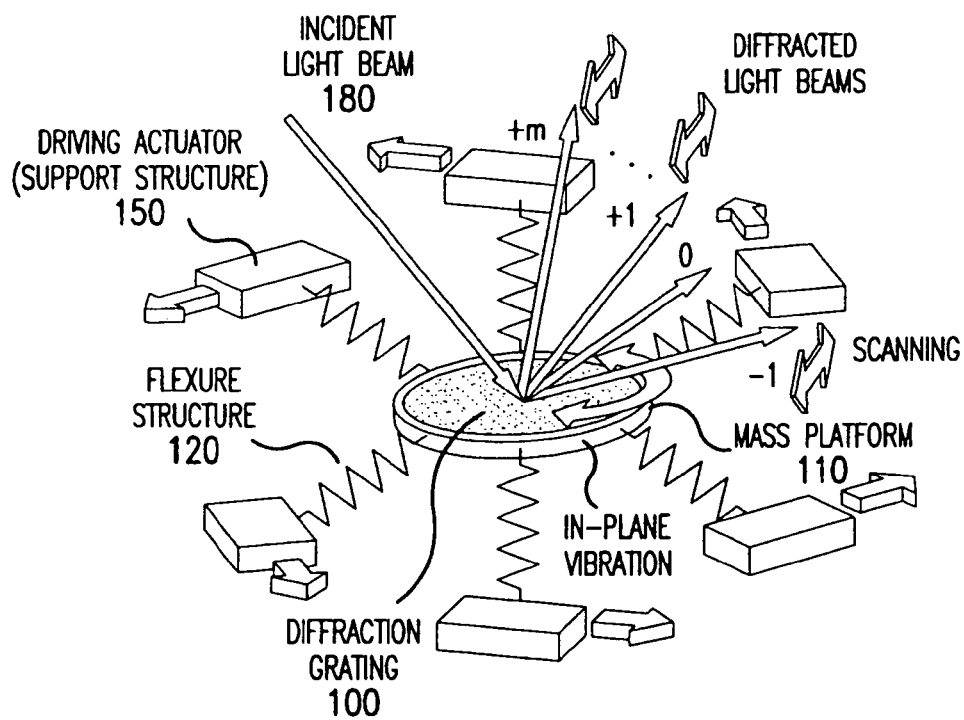
FIG. 2A schematically illustrates an optical scanner using a vibrating diffraction grating with the grating platform connected to driving actuator through flexures.

FIG. 2A shows a Micro-Electro-Mechanical (MEM) structure that includes at least one diffraction grating 100, a mass platform 110, at least one flexure structure 120, that connects the mass platform to at least one driving actuator 150. The diffraction grating 100 is formed on the mass platform 110. The driving actuator 150 may be vibrated translationally or rotationally or in a combination of both at the desired operating frequency. This motion is then transferred to the mass platform 110 through the flexure structure 120 to perform an in-plane rotational and/or translation vibration.

Figure 2B:
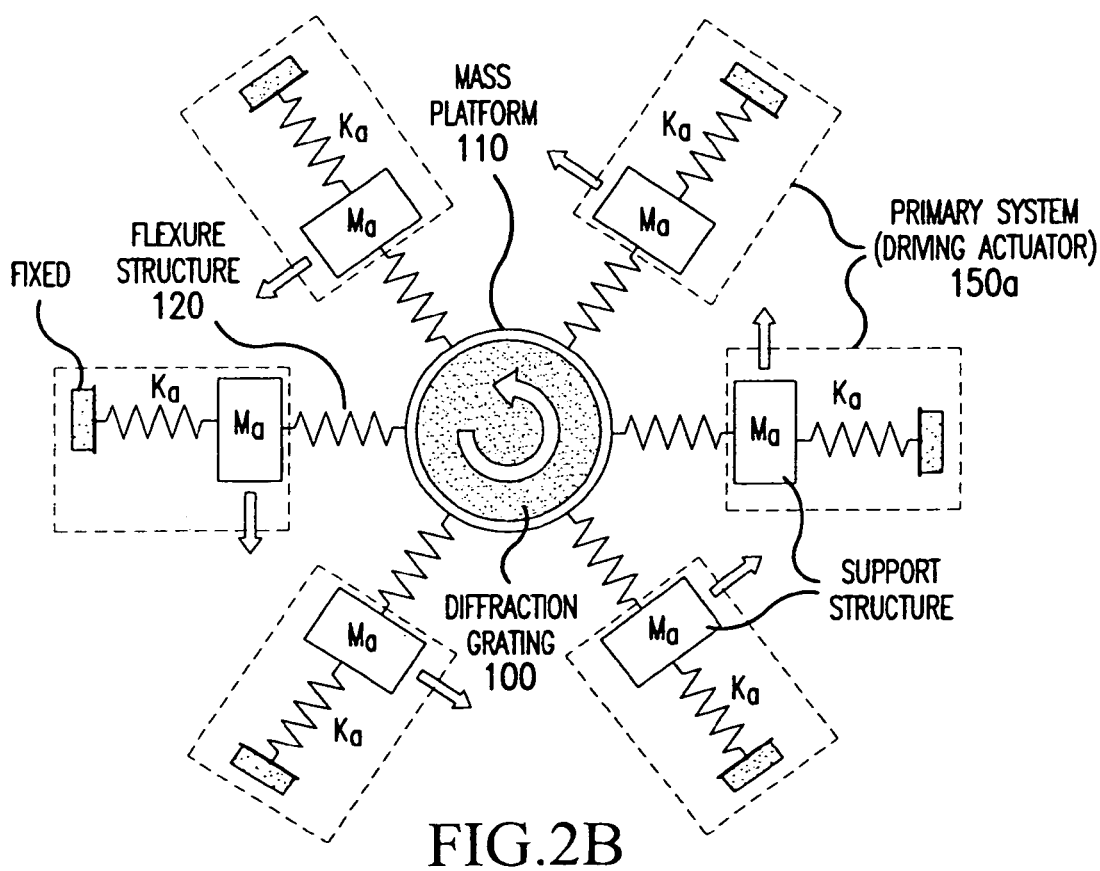
FIG. 2B schematically illustrates an optical scanner using a vibrating diffraction grating with the grating platform connected to driving actuator through flexures. The driving actuator composes another spring-mass system.
Figure 3:
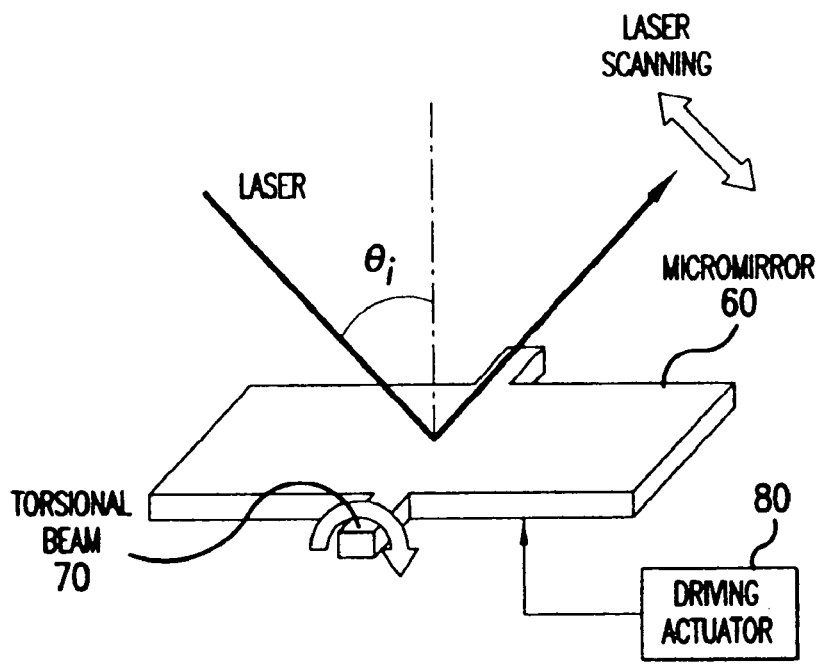
FIG. 3 shows a micromachined scanning mirror.
Figure 4:
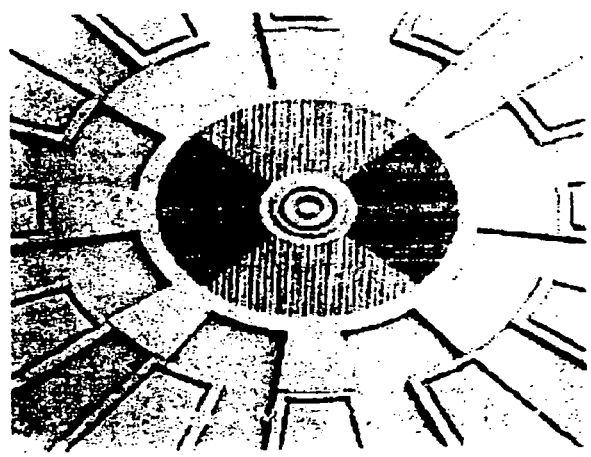
FIG. 4 shows a diffraction grating using a polysilicon micromotor.

As shown in the FIG. 2B, the driving actuator 150a can be composed of at least one spring-mass system. The term "primary system" is referenced to the driving actuator spring-mass system. The term "secondary system" is referenced to the mass platform and the flexure suspension that connects the mass platform to the driving actuators. The primary system (driving actuator spring-mass system) 150a drives the mass platform 110 into an in-plane vibratory motion. The vibrating grating scanner can then be treated as a multiple degrees of freedom vibratory system. In this case, the "vibration absorption" mechanism can be applied to the system. In the "vibration absorption" regime, the input power pumped into the primary system (driving actuator spring-mass system) 150a goes entirely into the secondary system (mass platform and flexure structure) 110 assuming a constant power dissipation mechanism within the system. Consequently, the vibratory motion amplitude of the primary system (driving actuator spring-mass system) 150a is much smaller than that of the secondary mass system (mass platform and flexure structure) 110. This is advantageous for MEMS driving actuators that are incapacitated by the lack of sufficient driving displacement amplitude range.

Various operation modes of the MEM structure of FIG. 1 and FIG. 2A and 2B are possible depending upon the amplitude, frequency and location of an oscillatory excitation force (or displacement) produced by the driving actuator. To achieve scanning a light beam 180, is directed to and diffracted by the diffraction grating. During operation, the platform undergoes a rotational in-plane vibration or a combined translational and rotational in-plane vibration. As a result, the orientation of the grating lines changes periodically, which in turn causes the diffracted light beam to scan. Although the diffraction grating shown in FIG. 1 is a reflection grating, the scanning mechanism is also applicable to a transmission grating.

The dynamic non-rigid-body deformation of a thin plate during rotational in-plane excitation has a much smaller magnitude than the rotational out-of-plane excitation. Consequently, the inventive diffraction grating laser scanner has the ability to scan at high frequencies without the optical performance degradation due to dynamic non-rigid-body deformation inherent in out-of-plane micromirror scanners. Furthermore, due to the nature of free-standing vibratory micromachined structures, this scanner is able to operate at high frequencies, in the order of tens of kHz with negligible wear and tear as compared to a conventional non-vibratory micromachined diffraction grating scanner, such as a grating driven by a micromotor.

In FIGS. 1, 2A and 2B, additional flexure structures, driving actuators and fixed supports can be incorporated to the MEM structure, if required. For example, multiple flexure structures, driving actuators and fixed supports can be attached symmetrically to the mass platform such that when a particular vibration mode is excited, the vibration center of the MEM structure coincides with the geometric center of the platform. In other words, the platform and diffraction grating undergo a pure rotational in-plane vibration around its center-of-mass. As a result, the grating area can be effectively used and the efficiency of the scanner can be maximized. Also, the driving actuator can directly actuate the support structure, the flexure or the platform.

Figure 5A:
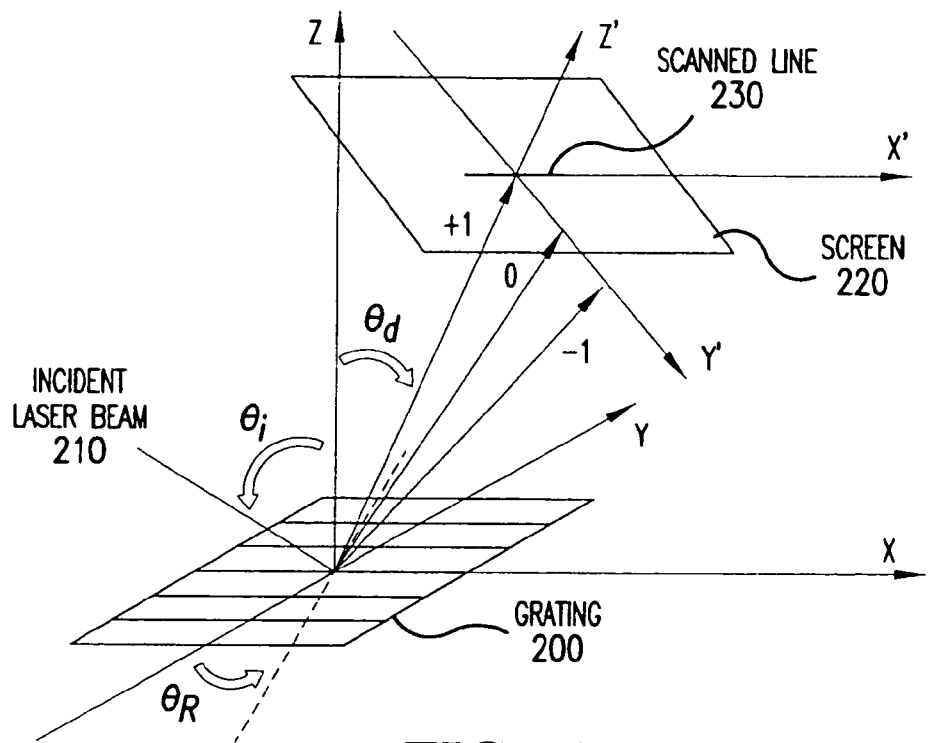
FIG. 5A illustrates the principle of the diffraction grating scanner.

FIG. 5A illustrates the principle of the diffraction grating scanner. FIG. 5A shows a grating 200, with a spatial period of $\Lambda$ that lies in the XY plane, and the grating lines are orientated parallel to the X-axis. An incident laser beam 210, with a wavelength of $\lambda$ lies in the YZ plane and illuminates the grating at an angle of incident $\theta_i$. Diffraction theory dictates that all the diffracted beams will lie in the YZ-plane. A projection screen 220 is placed at a distance l from the grating with its normal vector parallel to the direction of the selected diffraction order, and the projection screen 220 shows the scanned line 230. As the diffraction grating rotates about the Z-axis, the diffracted beams (except $0^{th}$ order) scan accordingly. The projected scan image of the selected diffraction beam on the screen can be calculated using the directional cosines of the beam, which can be obtained by the following equations:

$$\cos\alpha = -\frac{m\lambda}{\Lambda}\sin\theta_R \quad (1)$$

$$\cos\beta = -\frac{m\lambda}{\Lambda}\cos\theta_R + \sin\theta_i \quad (2)$$

$$\cos\gamma = (1 - \cos^2\alpha - \cos^2\beta)^{1/2} \quad (3)$$

where α, β and γ are the direction cosine angles of the selected diffraction beam with regard to the positive X, Y and Z axes respectively, m is the chosen diffraction order, $\theta_R$ is the grating rotation angle. In FIG. 5A, $\theta_d$ is the beam diffraction angle.

Figure 5B:
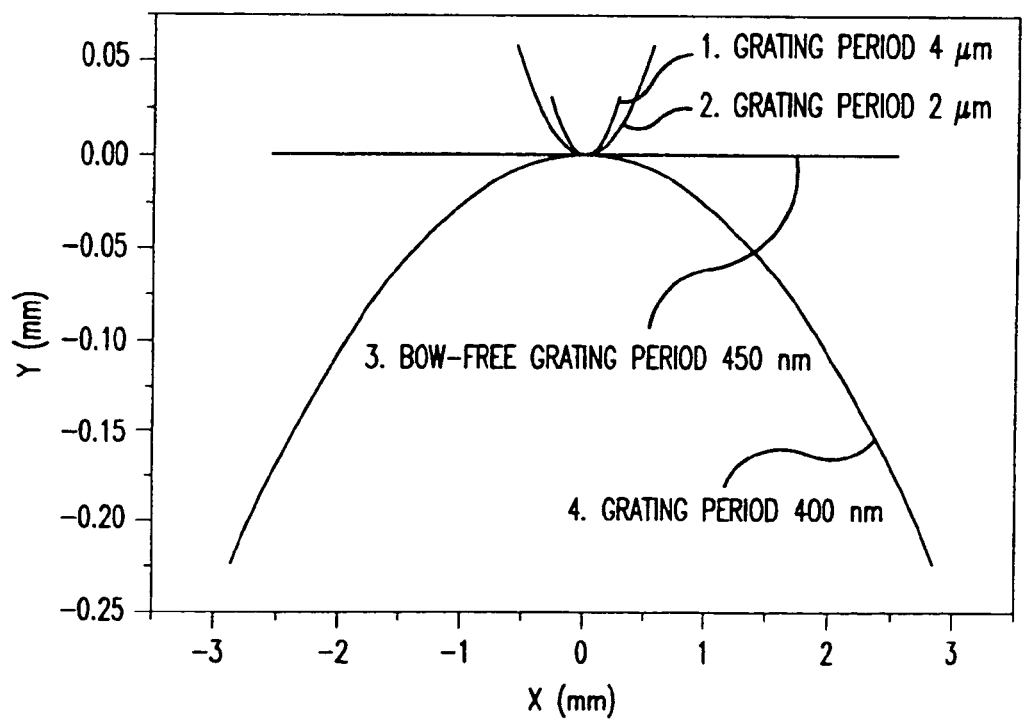
FIG. 5B shows the calculated scan image on the screen for the first diffraction order.

FIG. 5B shows the calculated scan image on the screen 220 for the first diffraction order (commonly used in most diffraction grating laser scanners). The distance between the grating 200 and screen 220 is assumed to be 10 mm. It can be observed that the optical scan angle increases when the grating period reduces. For example, when the grating rotation angle is about 20 degrees and the grating period is about 4 μm, the optical scan angle of the first diffraction order is only 3 degrees for a 635 nm wavelength laser beam with an incident angle of 45 degrees. However, the optical scan angle can be as large as 28 degrees for the same grating rotation angle $\theta_R$, when the grating period is reduced to 450 nm. In FIG. 5B, it is also observed that the scanning pattern on the screen is not an ideal straight line. However, the scan-bow, defined as the percentage deviation from the ideal straight line, can be minimized by adjusting the spatial period of the grating Λ. For the first diffraction order, when the value of the grating period Λ resides within a specific range, i.e., $0.618\lambda \leq \Lambda \leq \lambda$, the scanner will produce a scan-line 230 that is virtually bow-free for proper incidence and diffraction angles defined by the following equations:

$$\sin\theta_i = \frac{\lambda}{\Lambda} - \frac{\Lambda}{\lambda}, \quad (4)$$

$$\sin\theta_d = \frac{\Lambda}{\lambda}, \quad (5)$$

The curve traces 1-to-4 in FIG. 5B correspond to the following scan angles: 3, 6, 28 and 32 degrees respectively. The curve trace-3 with a scan angle of 28 degrees in FIG. 5B shows the calculated scanned pattern on the screen when Equations (4) and (5) are satisfied.

Figure 6A:
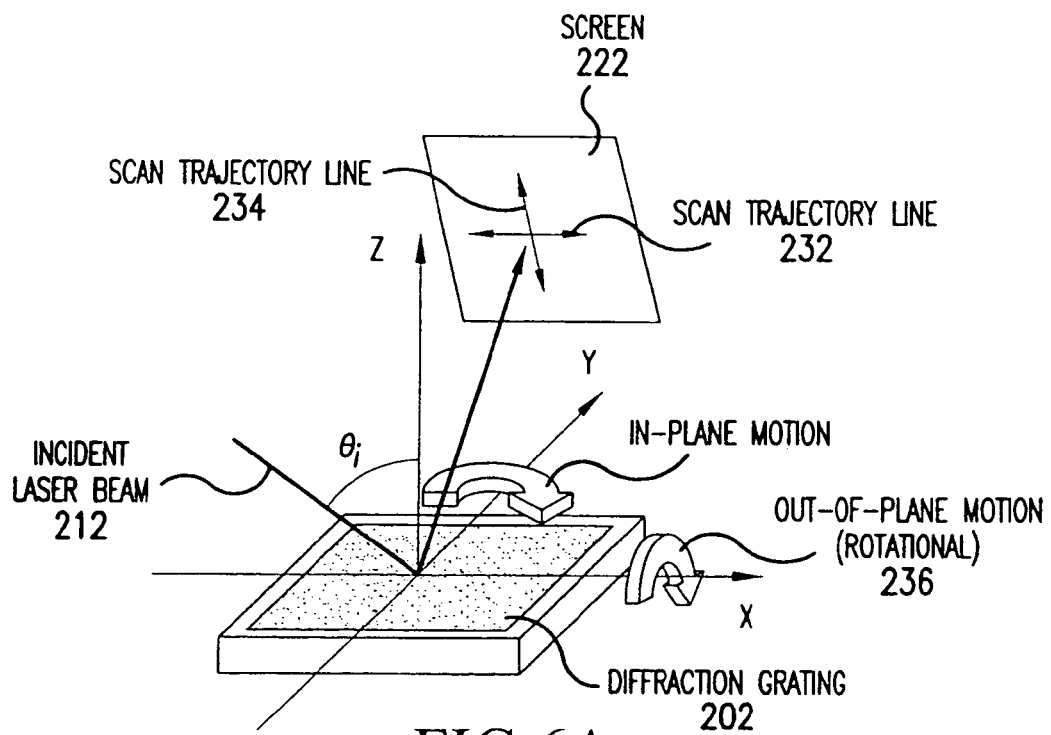
FIG. 6A illustrates the multi-dimensional scanning principle of the diffraction grating scanner using in-plane motion in combination with out-of-plane rotational motion.

The platform and diffraction grating need not execute or undergo an ideal in-plane motion, as for some applications, the combined in-plane and out-of-plane motion can be utilized for multi-dimensional scanning without jeopardizing the performance. FIG. 6A shows the principle of the multi-dimensional scanning of the diffraction grating scanner using in-plane motion in combination with out-of-plane rotational motion.

Figure 6B:
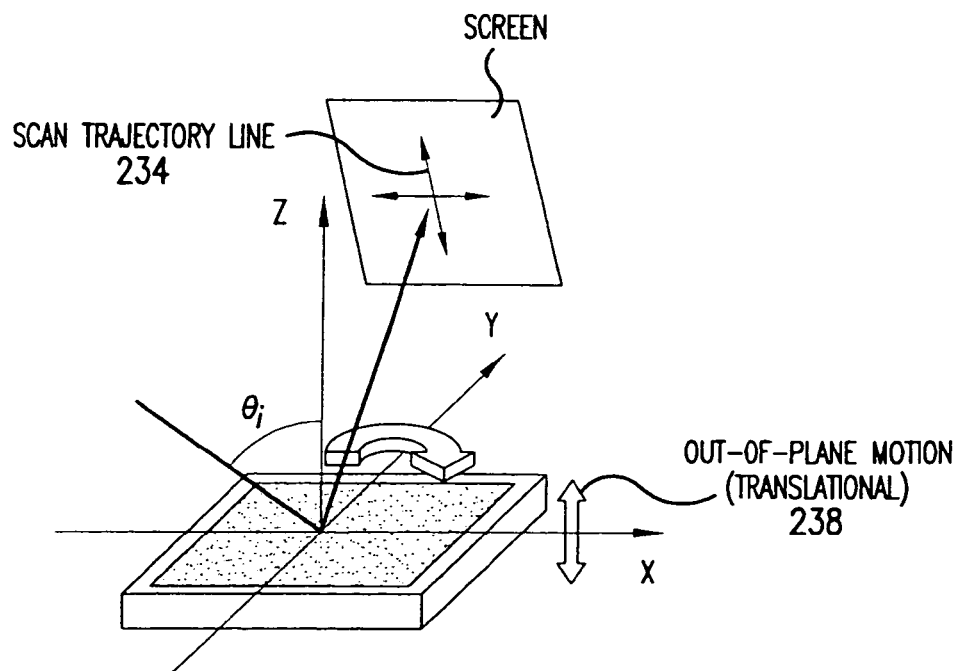
FIG. 6B illustrates the multi-dimensional scanning principle of the diffraction grating scanner using in-plane motion in combination with out-of-plane translational motion.

FIG. 6A shows a grating 202 that lies in the XY plane, and the grating lines are orientated parallel to the X-axis. An incident laser beam 212 lies in the YZ plane and illuminates the grating at an angle of incident $\theta_i$. Diffraction theory dictates that all the diffracted beams will lie in the YZ-plane. A projection screen 222 is placed at a distance from the grating with its normal vector parallel to the direction of the selected diffraction order, and the projection screen 222 shows the multi-dimensional scan trajectory lines 232 and 234. The scan trajectory line 232 corresponds to the diffraction grating rotation about the Z-axis (in-plane motion) while the scanned trajectory line 234 corresponds to the diffraction grating rotation about the X-axis (out-of-plane rotational motion 236). The aforementioned scan trajectory line 234 can also be produced when the diffraction grating translates in the Y-axis direction (out-of-plane translational motion 238) as shown in FIG. 6B.

In many optical scanning applications, particularly in raster scanning displays, there are two scan trajectories; one termed the slow trajectory and the other the fast trajectory. Based on the present invention, the fast scan trajectory can be accomplished by the in-plane grating rotation while the slow scan trajectory can be accomplished by the out-of-plane motion (rotational and/or translational) of the grating platform. Since the scan rate of the out-of-plane motion is defined by the video rate (typically <100 Hz), the dynamic deformation of the grating platform due to this slow out-of-plane motion is negligible and therefore will not jeopardize the optical resolution.

Figure 7:
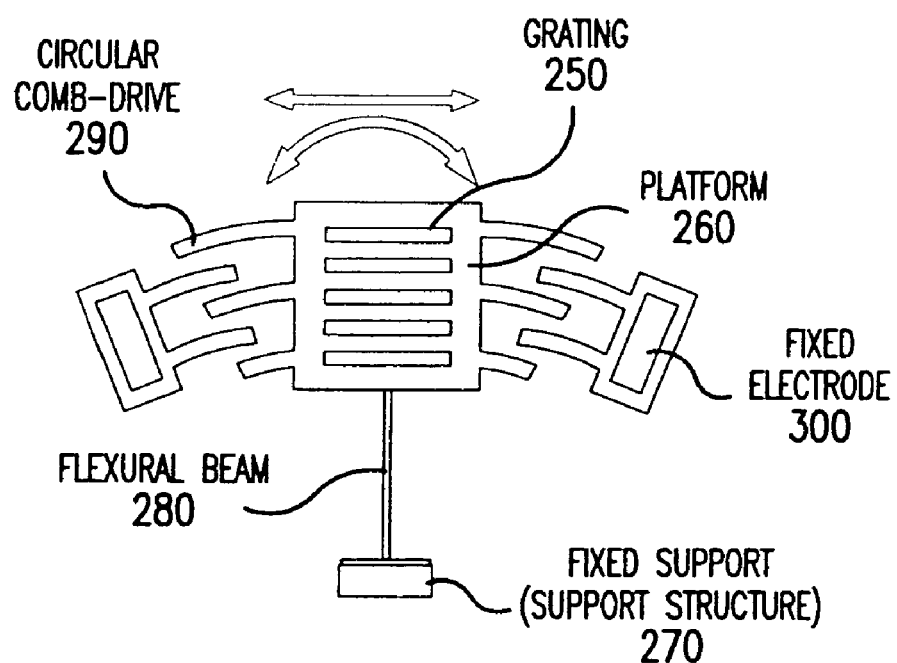
FIG. 7 illustrates a plan view of a first embodiment of the MEM structure of the invention.

FIG. 7 shows a plan view of a first embodiment of the MEM structure of the invention. The diffraction grating 250 and platform 260 are connected to the support structure 270 through a flexural suspension 280. The support structure 270 in this case is mechanically anchored to the substrate (not shown). The platform is actuated directly by including a pair of concentric interdigitated circular comb fingers 290 with one secured to a fixed electrode 300 and the other attached to the platform 260. By applying a cyclic voltage between the fixed and movable fingers, the MEM structure can be driven into in-plane vibratory motion due to the electrostatic actuation forces. The MEM structure can be driven either using one side of interdigitated finger structures or differentially (push-pull) using two sides of comb drives. Under the excitation of the comb drives, the diffraction grating undergoes a combined translational and rotational motion. From diffraction theory, the direction of a diffracted laser beam depends only on the incidence angle and orientation of the grating lines, and the scanning angle of the diffracted beam is therefore insensitive to the translational motion of the grating.

Although the scanning angle of the diffracted beam is independent of the translational motion of the grating, in order to utilize the grating area effectively and maximize the efficiency of the scanner, it is desirable to eliminate the translational vibration of the grating such that it only undergoes a pure rotational vibration around its geometrical center. This can be understood from FIGS. 8A and 8B. In FIG. 8A, the diffraction grating has a circular aperture, and the diameter of the incident beam is equal to or slightly larger than the diameter of the grating. When the platform is at the initial position, the incident beam covers the whole grating area (see incident beam 1 in FIG. 8A). When the platform undergoes a combined translational and rotational in-plane vibration as shown in FIG. 8A, the effective area of the grating (defined as the area of the grating that is illuminated by the incident light) varies constantly with time. As a result, the intensity of the output light beam fluctuates during the scanning, which is undesirable in many applications. As shown in FIG. 8B, in order to overcome this problem, the area of illumination should be either large enough to cover all the extreme positions of the grating (see incident beam 2 in FIG. 8B) or small enough to be always covered by the vibrating grating (see incident beam 3 in FIG. 8B). In the first approach, a portion of the incident light is not diffracted by the grating thus resulting in a lower optical efficiency. In the second approach, the area of the grating is not fully utilized resulting in an increased scanned spot size and reduced optical resolution. Therefore for maximum overall device efficiency, a pure angular vibration around the geometrical center of the grating is always desirable for the miniaturized vibratory diffraction grating scanner.

FIG. 9 shows a plan view of a second embodiment of the MEM structure of the invention. In this embodiment, multiple flexural suspensions 310, are attached symmetrically (180°) to the platform 320, to suspend it from the support structures 330, that are secured to the substrate. Electrostatic comb drives 340 include pairs of concentric interdigitated fingers whose center coincides with the geometrical center of the grating 350, are attached directly to the platform 320. The concentric interdigitated fingers are interdigitated with the fingers of the fixed electrodes 360. The MEM structure shown in FIG. 9 can be actuated into a pure angular vibration around the grating center.

Figure 10A:
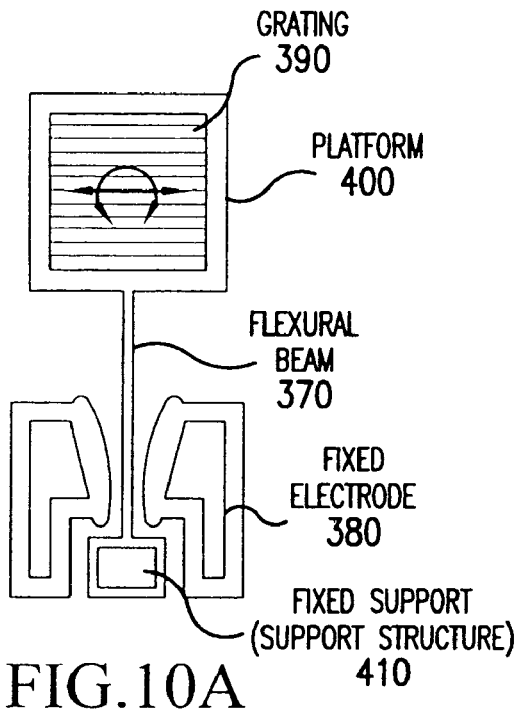
FIGS. 10A and 10B show a plan view of a third embodiment of the MEM structure of the invention.
Figure 10B:
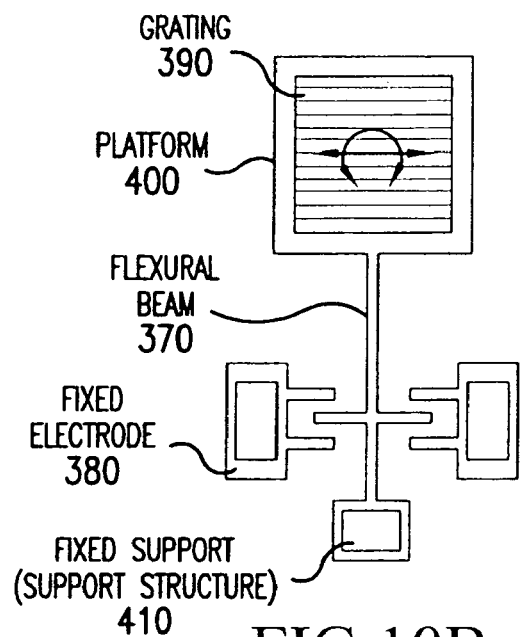

FIG. 10 shows a plan view of a third embodiment of the MEM structure of the invention. In this embodiment, contrary to the MEM structures shown in FIGS. 7 and 9, the excitation force is now exerted on the suspension flexure (flexural beam) 370, which acts as an electrode. The electrostatic actuator comprises a stationary (fixed) electrode 380, formed on the substrate and a movable electrode formed on the flexural beam. The MEM structure also includes a grating 390 on a platform 400 that is attached to a fixed support 410 via the flexural beam 370. The stationary and movable electrodes can take any geometrical forms including parallel-plate (FIG. 10A) and interdigitated comb drive (FIG. 10B). The comb drive can be a circular comb drive. The MEM structure can be driven into in-plane vibratory motion using one actuator or differentially (push-pull) using two actuators placed opposite to each other. Although not shown in the figure, multiple driving actuators can also be placed along the flexural beam to excite a certain vibration mode of the MEM structure, typically a high-order vibration mode.

In all of the above-mentioned embodiments of the invention, the support structures are mechanically anchored to the substrate (e.g. semiconductor, glass, quartz, metal, or polymer chip), and power input to the system has been either directly to the platform containing the grating, or on the flexures. However, the support structure may not be necessarily fixed (anchored) but can also be movable. In fact, the power input to the MEM structure through the vibration of the support structure, has particular advantages, for example, it is convenient to form a resonator with multi-degrees of freedom to take advantage of the "vibration absorption" mechanism.

Figure 11:
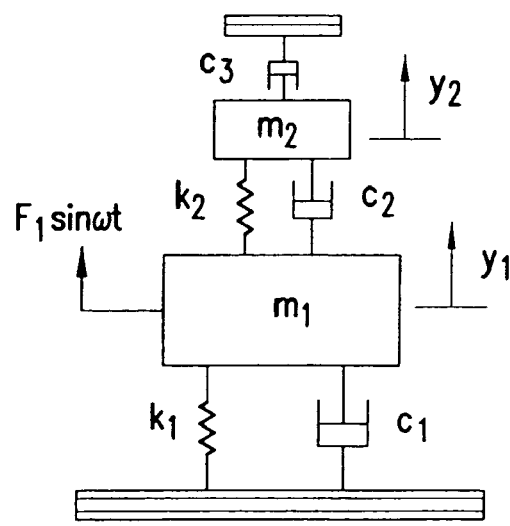
FIG. 11 illustrates the schematic of a classical dynamic vibration absorber system.

The concept of the dynamic vibration absorber or "vibration absorption" can be understood by considering the response of a single degree of freedom mechanical system subjected to a rectilinear vibratory force operating at a frequency, which is the same as the resonant frequency of the system. This response can be reduced by adding a secondary mass, which has a motion relative to the primary system. In FIG. 11, a mass $m_1$, called the primary mass, attached to a rigid foundation through a spring of stiffness $k_1$ and damper $c_1$, is excited by a harmonic excitation, whose frequency is near $\sqrt{(k_1/m_1)}$. This forms the primary "actuator" system. An absorber of mass $m_2$ is connected to the original mass $m_1$, through another elastic element of stiffness $k_2$ with dampers $c_2$ and/or $c_3$, thus forming the secondary "absorber" system. This secondary mass and its support are commonly called a dynamic vibration absorber. This absorber system when correctly tuned and attached to a vibrating body subject to a harmonic excitation, causes the steady-state motion of the point to which it is attached to cease. By careful tuning of the absorber, the response of the system to the vibratory force acting at the operating frequency can be reduced to negligible proportions. By fitting a secondary damper in series with the primary mass or in series with the secondary mass and in parallel with its support the frequency bandwidth over which the response is reduced can be considerably increased, although not such large reduction can be achieved as for the undamped absorber. When a damper is used in the secondary system, energy is dissipated in the damper and the system becomes a true dynamic vibration absorber. Also, see the system of mass $M_a$ and stiffness $K_a$ in FIG. 2a.

Control of the primary system resonance can be achieved by adding a vibration absorber that is passive or active. In the passive case, a secondary physical mass is attached to the primary mass through an elastic structure. If the system parameters are chosen properly, then the device is made to limit the primary vibrations by absorbing the external energy imparted to it. For active absorbers, the device is replaced by a control system that counteracts the undesired vibrations. This presents more flexibility than the passive absorbers, but fundamentally the principle of transferring energy from the primary system to a secondary system remains intact. For applications in our present invention, the focus is on the secondary system and not the primary system. The objective is to gain as much rotational and/or translational displacement amplification as possible for the secondary mass system. The resulting system may have two or more degrees of freedom. The embodiment shown in FIG. 12 has been physically realised as a multi-degree of freedom vibration absorber system.

Figure 12:
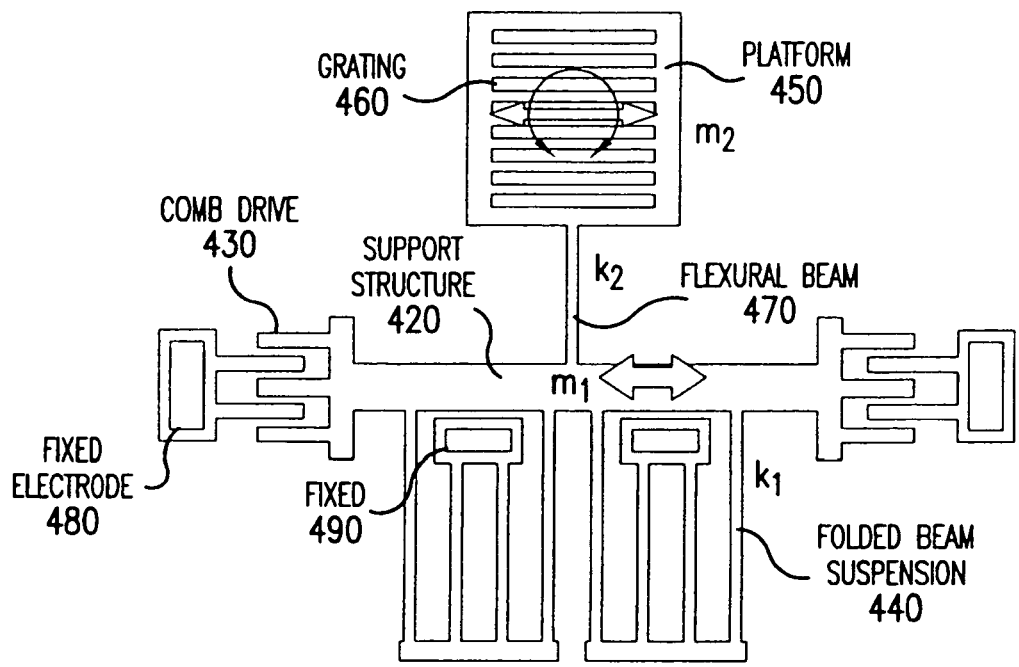
FIG. 12 illustrates a plan view of a fourth embodiment of the MEM structure of the invention.

FIG. 12 illustrates a plan view of a fourth embodiment of the MEM structure of the invention. In this embodiment, the support structure 420, is driven by a comb drive resonator 430, with folded-beam suspensions 440. This structure is fixed by a post 490 to the substrate (not shown). The platform 450, and the grating 460, are attached to the support structure through a flexure beam 470. In response to a cyclic actuation voltage, the support structure vibrates translationally at the operating frequency. The translational motion of the support structure is then transferred to the grating as a combined in-plane translational and rotational vibration, which changes the orientation of the grating lines causing the diffracted laser beam to scan.

In the embodiments shown in FIGS. 7, 9 and 10, the comb drives are directly attached to the platform. During operation, when the amplitude of the oscillation of the comb drive exceeds a certain value, an electromechanical side pull-in occurs. Here the electromechanical side pull-in refers to the situation in which the movable fingers move perpendicular to the desired motion path and contact the fixed fingers causing a malfunction on the actuator. Consequently, in these embodiments, the electromechanical side pull-in limits the maximum rotation angle of the platform and thus limits the optical scan angle.

In contrast, the comb drive in the fourth embodiment shown in FIG. 12 is not directly attached to the platform. As a result, the structure has the ability to ease or even eliminate the electromechanical side pull-in effects and therefore has the potential to scan an optical angle much larger than the embodiments shown in FIGS. 7, 9 and 10. The MEM structure shown in FIG. 12 can be treated as a resonator with multiple degrees of freedom. It can be divided into a primary system comprising the comb drives $m_1$, and folded-beams $k_1$, and a secondary system comprising the platform $m_2$, and flexure beam $k_2$. Various operating modes of the secondary system are possible depending upon the amplitude and frequency of an oscillatory actuation voltage applied to the primary system. When the natural frequency of the desired vibration mode of the secondary system matches the resonant frequency of the primary driving system and the inertial mass of the primary system is much larger than that of the secondary system, a phenomenon known as "vibration absorption" occurs. In the "vibration absorption" regime, the input power pumped into the primary driving system goes entirely into the secondary system assuming a constant power dissipation mechanism within the system. Consequently, the vibratory motion amplitude of the secondary system is much larger than that of the primary driving system. For example, the amplitude of the angular vibration of the platform can be in the order of 10 degrees or larger, while the amplitude of the translational motion of the comb-drive is only in the order of one micron or less, if the MEM structure shown in FIG. 12 is designed to be operational in the "vibration absorption" regime. As a result, the diffraction grating scanner is able to scan an optical angle larger than 28 degrees, while the comb drive is still working safely within a stable operating region.

Figure 13:
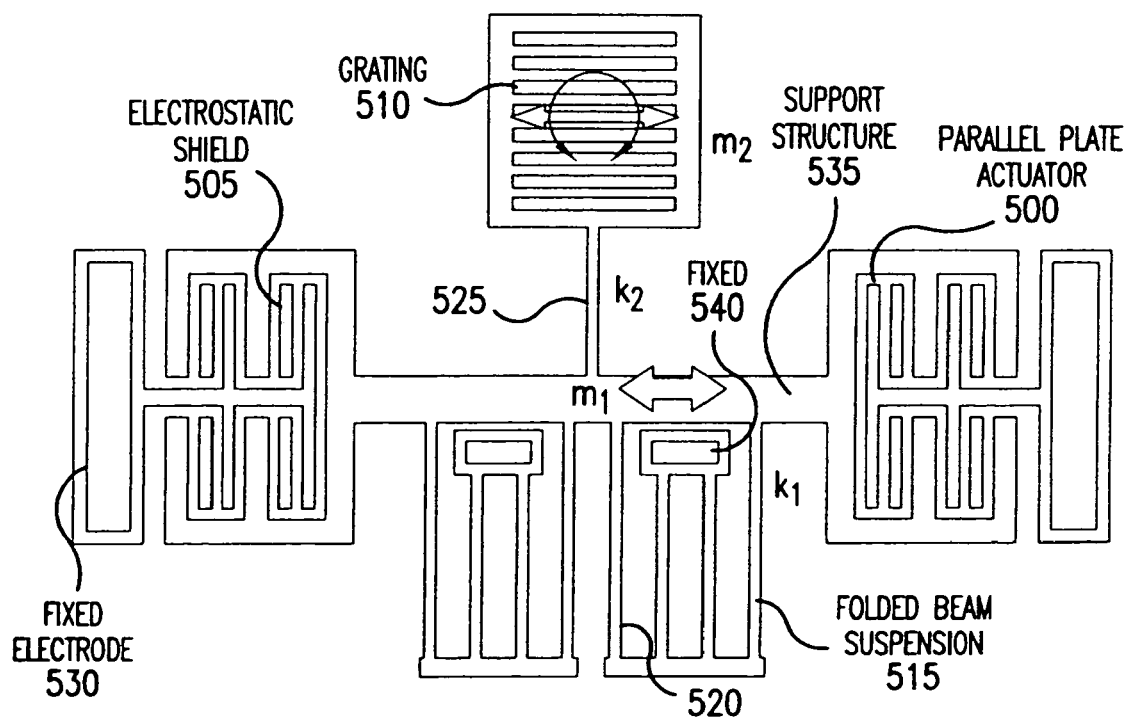
FIG. 13 illustrates a plan view of a fifth embodiment of the MEM structure of the invention.

FIG. 13 illustrates a plan view of a fifth embodiment of the MEM structure of the invention. Since only a very small oscillatory motion of the primary driving system is required to produce a substantially larger angular vibration of the secondary system when the MEM structure is working under a "vibration absorption" condition, the comb drive actuator of the primary system can be replaced with a parallel-plate electrostatic actuator 500, that can provide a translational motion on the order of one micron or less with a low driving voltage typically less than 20 volts but with a higher force magnitude compared to comb-drive actuator. The electrostatic shield 505, may be present or can be eliminated by designing the parallel plate actuator with an asymmetrical gap. The structure also includes a grating 510, a support structure 535, and a folded beam suspension 515 that includes flexure elements 520 aligned parallel to the flexural beam 525. The suspension and the structure are fixed to the substrate (not shown) via posts 540. The electrostatic shield 505 and the fixed electrode 530 are fixed to the substrate. The invention generally shows four flexure elements for the folded-beam suspension, but the invention is not restricted to four flexure elements, and any appropriate number of flexure elements can be used.

Figure 14:
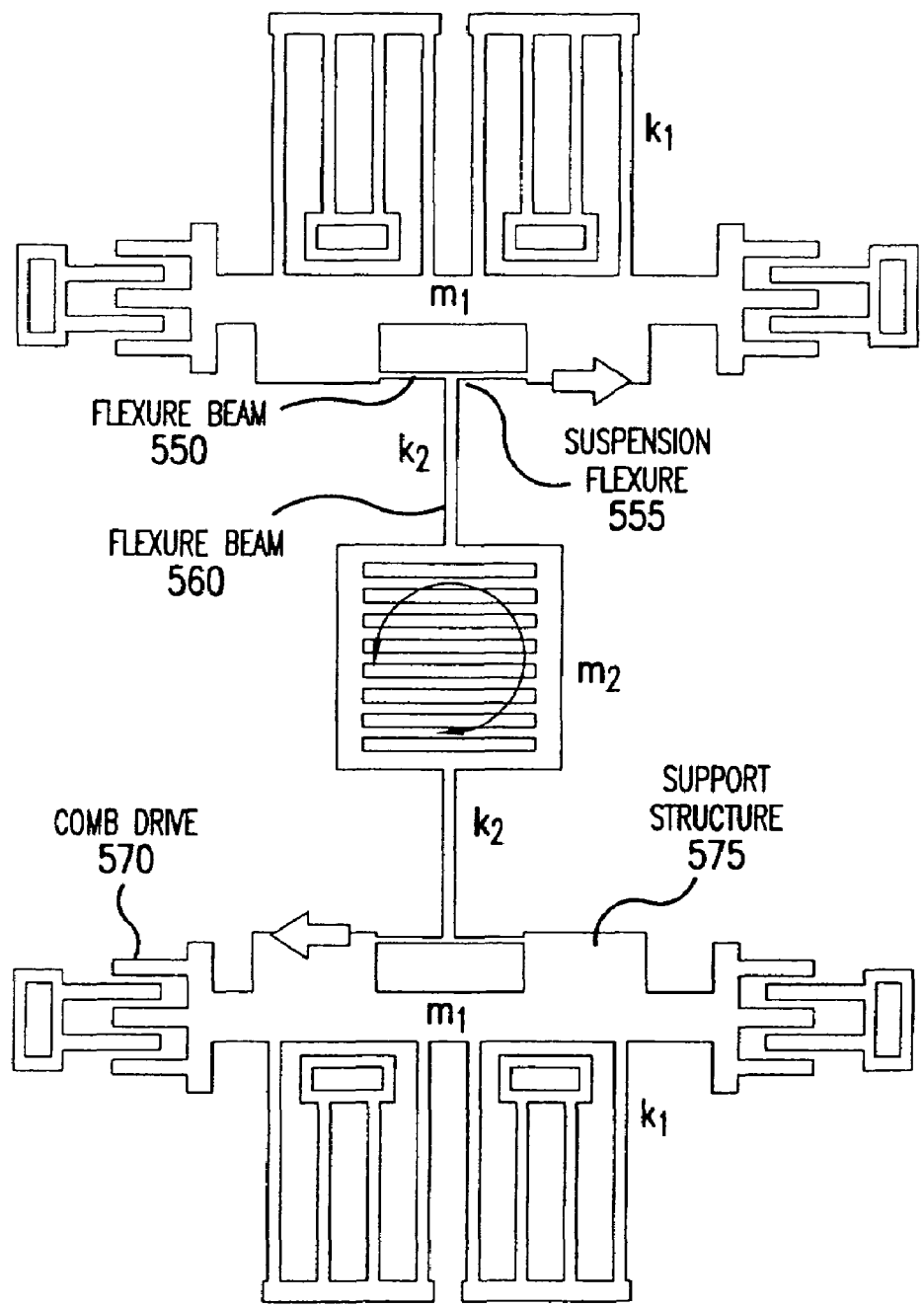
FIG. 14 illustrates a plan view of a sixth embodiment of the MEM structure of the invention.

FIG. 14 illustrates a plan view of a sixth embodiment of the MEM structure of the invention. In this embodiment, two sets of flexural suspensions 555, support structures 575 and comb drive actuators 570 are attached symmetrically opposite to the platform. The flexural suspension consists of two beams placed in a "T" like pattern. The flexural (or flexure) beam 550, shown in FIG. 14 is used to release the axial stress of the flexural (or flexure) beam 560, during a large angular vibration. The two support structures are driven by the comb drives 570 to produce translational vibrations with a phase difference of 180 degrees relative to each other. The translational vibrations of the support structures transfer through the suspension flexures to the platform causing a pure rotational vibration around its center. The "vibration absorption" mechanism can also be applied to this embodiment and the comb drives can be replaced with electrostatic parallel-plate actuators to take advantage of low driving voltage.

Figure 15:
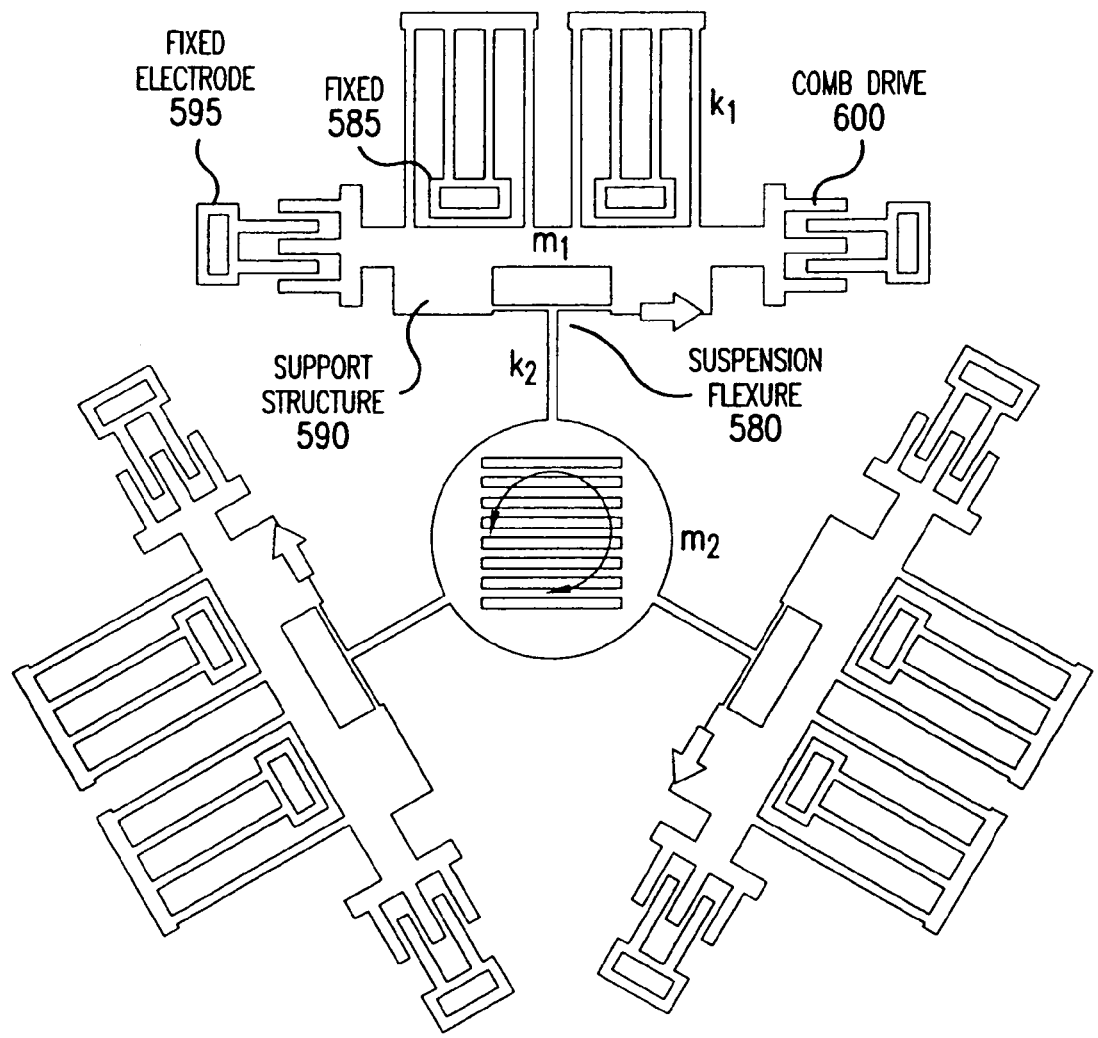
FIG. 15 illustrates a plan view of a seventh embodiment of the MEM structure of the invention.

It is also possible to attach multiple sets of flexural suspensions 580, support structures 590 and comb drive actuators 600 symmetrically to the platform as shown in FIG. 15. Here, the flexural suspensions are spaced at 120° angles. In this case, the actuators have to be synchronized (with a predetermined phase relation between the multiple actuators) in order to excite a pure angular vibration of the platform.

The size of the inventive structures is not restricted to the micro-scale. The platform carrying the grating can have a size of 1 mm$^2$ or less. Platforms having a size of 1-10 mm$^2$ can also be used. Also, the invention is not restricted to silicon material, and any suitable material can be used.

The actuators used in the invention can be selected from any suitable actuator. The excitation force (or displacement) produced by the drive actuator can be applied directly on the mass platform, or on the flexure structure, or both. The driving actuator can be a direct power drive mechanism using electromagnetic, piezoelectric, electrostatic, optical, electrothermal or any other energy conversion drive. The driving actuator drives the mass platform into an in-plane vibratory motion which can be rotational and/or translational. Further modifications can also be made such that the driving actuators be designed to provide motion in in-plane and out-of-plane direction for multi-dimensional scanning.

The driving actuator can be composed of at least one spring-mass system. The term "primary system" is referenced to the driving actuator spring-mass system. The term "secondary system" is referenced to the mass platform and the flexure suspension that connects the mass platform to the driving actuators. The primary system (driving actuator spring-mass system) drives the secondary system (mass platform and flexure structure) into an in-plane vibratory or oscillatory motion which can be rotational and/or translational. As shown in FIG. 2B, the grating scanner can then be treated as a multiple degrees of freedom vibratory system. In this case, "vibration absorption" mechanism can be applied to the system. In the "vibration absorption" regime, the input power pumped into the primary system (driving actuator spring-mass system) goes entirely into the secondary system (mass platform and flexure structure) assuming a constant power dissipation mechanism within the system. Consequently, the vibratory motion amplitude of the primary system (driving actuator spring-mass system) is much smaller than that of the secondary system (mass platform and flexure structure). This is advantageous for MEMS driving actuators which are incapacitated by the lack of sufficient driving displacement amplitude range.

The mass platform can be of any geometric shape and can contain at least one diffraction grating, and the flexure structure can be of any geometric topology while the fixed support forms a fixed reference point during the excited motion of the mass platform. The diffraction grating can be orientated at any angle with respect to the mass platform. The driving actuator can be connected to the mass platform, or the flexure structure, or both. The driving actuator drives the mass platform in an in-plane or oscillatory motion which can be rotational and/or translational.

Figure 16:
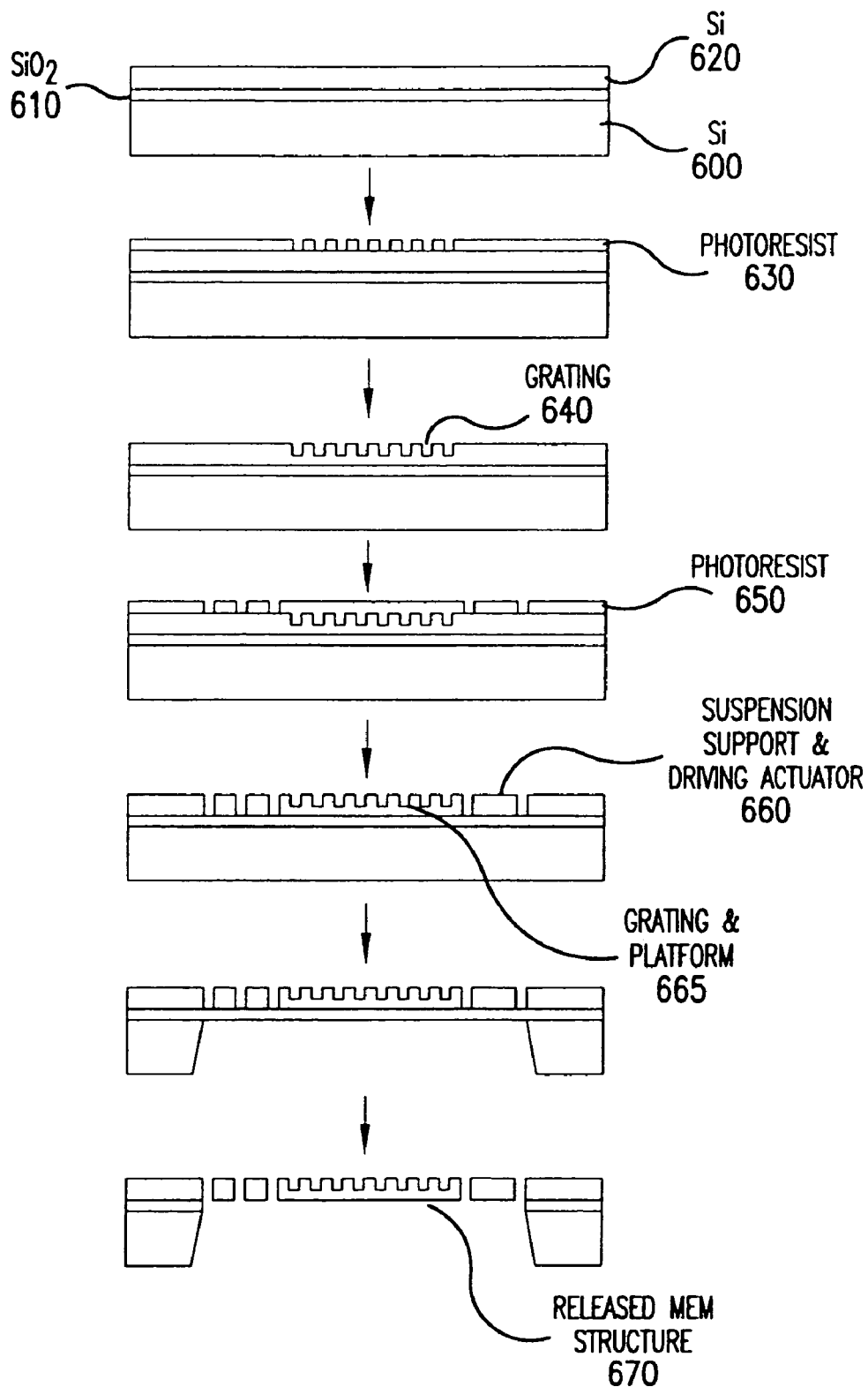
FIG. 16 shows one fabrication method for the MEM structures of the invention using SOI micromachining technology.

The MEM structures of the invention can be fabricated using micro- and/or nano-fabrication methods. FIG. 16 shows one example using Silicon-on-Insulator (SOI) micro-machining. The process begins with an SOI wafer that has a handle wafer 600 of 450-to-600 microns, oxide (e.g., SiO$_2$) 610 having a thickness of 0.2-to-2.0 microns and device layer 620 of 10-to-50 microns. The SOI wafer is coated with a thin photoresist layer 630, and then the grating pattern is formed using lithography method. If the period of the grating to be fabricated is less than one micron, the pattern can be formed using deep UV lithography, e-beam lithography, two-beam interference lithography or nano-imprinting. The grating pattern 640 is transferred to the silicon layer using RIE (reactive ion etch) etching. The depth of the etching step can be controlled to maximize the diffraction efficiency of the selected diffraction order used for scanning. Next, the SOI wafer is again coated with photoresist 650. After photolithography and DRIE (deep reactive ion etch) etching (stopping on the SiO$_2$ layer), the grating platform 665, suspension flexures, support structures and driving actuators 660 are formed. The SOI wafer is then patterned on the backside, and a following DRIE etching removes completely the exposed silicon substrate stopping on the $SiO_2$ layer. Then, the MEM structure is released 670 by etching the exposed $SiO_2$ layer.

Figure 17:
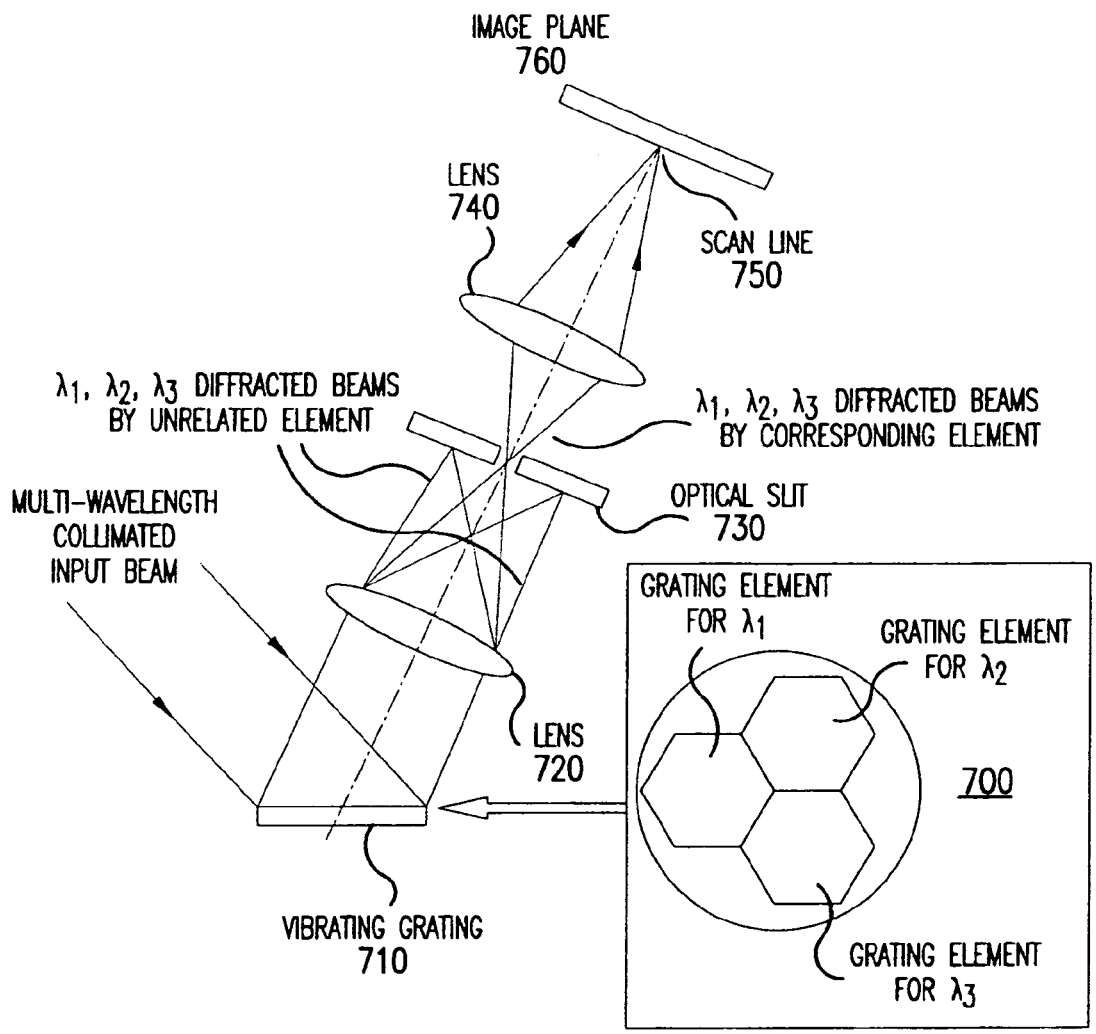
FIG. 17 illustrates multi-wavelength scanning system using the vibrating diffraction grating scanner.

In order to scan a color image, the scan lines of different wavelengths (primary colors: Red, Green and Blue) have to be essentially collinear. However, since diffraction gratings are dispersive elements, the different wavelengths leave the diffraction grating at different diffraction angles and may have different scanning velocities. As a result, a MEM structure having one diffraction grating period cannot be used for multi-wavelength scanning applications. To overcome this problem, a method has been established as shown in FIG. 17. In this method, multiple diffraction grating elements 700 are formed on the MEM vibrating platform 710, as shown in the inset of FIG. 17, and each has a different grating period. The grating elements all have the same line orientation and $\lambda/\Lambda$ (wavelength to grating period) ratio. Since the elements are formed on the same platform, they all have the same rotation angle when the platform vibrates. According to Equations (1), (2) and (3), since each element has the same $\lambda/\Lambda$ ratio, the beams of different wavelengths diffracted from their corresponding grating elements scan essentially collinear lines and have the same diffraction angles and scanning velocities. In FIG. 17, a light beam of a certain wavelength diffracted from its unrelated grating element has a different diffraction angle. By using a focusing lenses 720, 740 and an optical slit 730, these unwanted diffraction beams can be filtered out. In this fashion, and optimal scan line 750 forms on the image plane 760.

There are other methods of creating scanning resonant diffraction gratings using well-established fabrication methods of silicon micromachining (e.g. surface micromachining or bulk micromachining) or polymer microfabrication using imprint lithography, LIGA or injection molding in a foundry process. With these existing or new methods, one can form an actuated blazed grating with a variable angle, for example using active polymers, or a diffraction grating having a triangular surface profile thus providing improved diffraction efficiency when compared to the rectangular (binary) grating.

EXAMPLES

Figure 18:
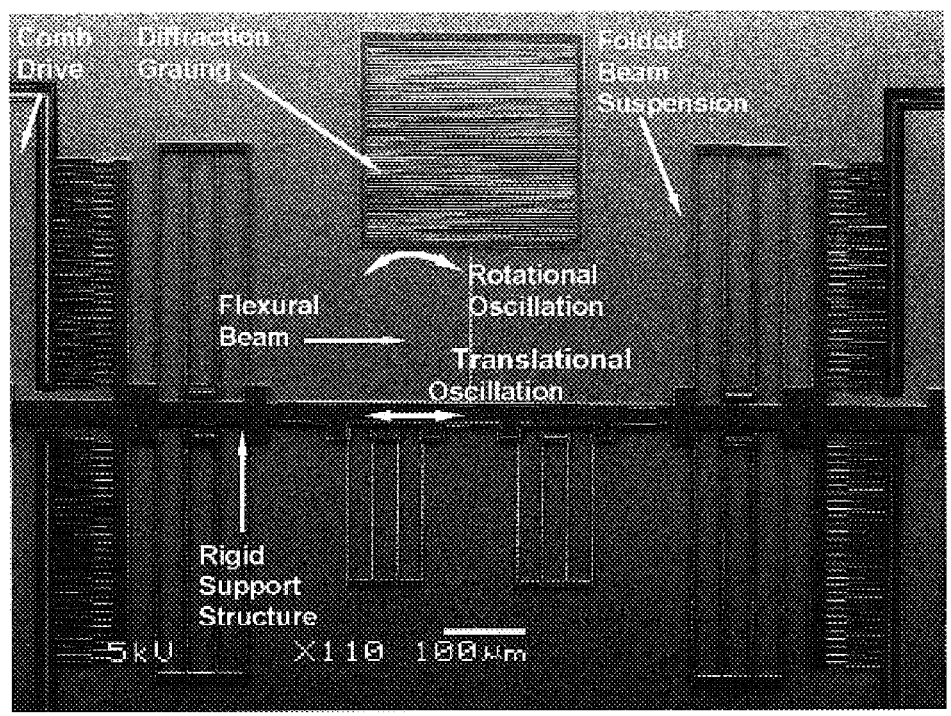
FIG. 18 shows the SEM micrograph of the physical device fabricated based on the fourth embodiment.

FIG. 18 shows an SEM image of the central part of the vibrating grating laser scanner fabricated and tested according to the fourth embodiment of the present invention shown in FIG. 12.

The resonant grating scanner was fabricated using a 3-layer Polysilicon surface micromachining process. The vibrating structures including the electrostatic comb-drive and diffraction grating was suspended 2 μm above the substrate by 8 sets of folded-beam flexures with beams having a length of 300 μm, width of 3 μm and thickness of 3.5 μm, and 2 sets of folded-beam flexures with beams having a length of 180 μm, width of 2 μm and thickness of 2 μm. This free-standing design eliminates any contact-friction between the vibrating structure and substrate. Two opposing interdigitated laterally-driven electrostatic comb-drives, each having a total number of 123 movable fingers with finger length of 50 μm, width of 3 μm, thickness of 3.5 μm, finger gap of 2 μm and overlap length of 25 μm, were used to generate the vibratory motion. The grating structure having an area of 268 μm×254 μm was composed of Polysilicon beams of length 268 μm, width 2 μm and thickness 2 μm separated by 2 μm air gaps (through-hole openings). The grating structure was supported on a connection beam of length 200 μm, width 2 μm and thickness 2 μm, located axially along the center-of-mass of the grating. When the comb-drive is vibrated translationally at the operating resonance frequency, the motion is transferred to the grating as a combined translational and rotational motion causing the diffracted laser beam to scan.

Figure 19:
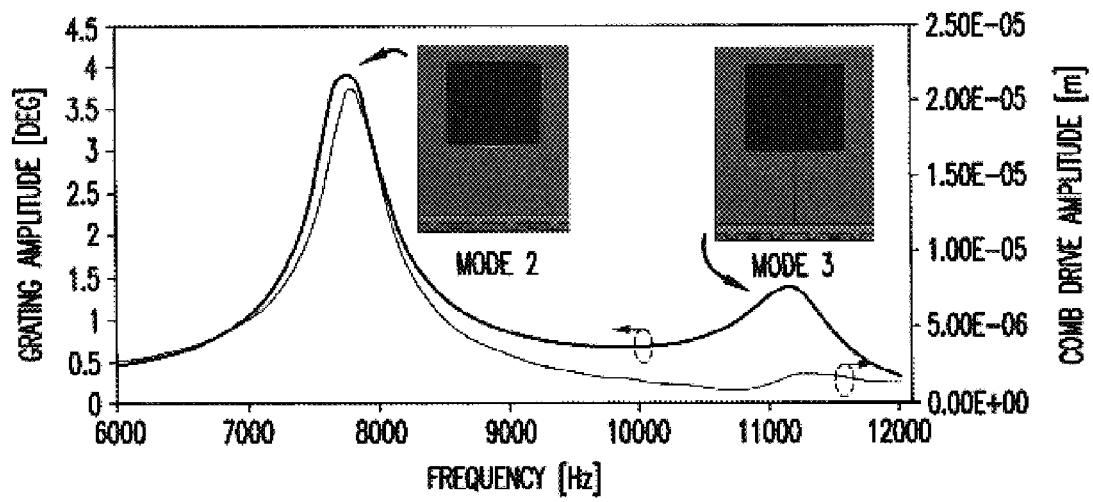
FIG. 19 shows the measured amplitude frequency response of the fourth embodiment prototype.

FIG. 19 shows the measured frequency response of the prototype of FIG. 18, revealing the two operating modes of the scanner. The low frequency and low amplitude behavior of Mode 1 is not shown in the figure, as it is irrelevant to the operation of the scanner. It is notable that Mode 3 (10.2 kHz) demonstrates the vibration absorption principle as outlined in the main text. Experiment results of Mode 3 demonstrate that the developed scanner is capable of scanning optical angles of 4 degrees ($1^{st}$-order), 7 degrees ($2^{nd}$-order) and 11 degrees ($3^{rd}$-order) at a resonant frequency of 10.2 kHz for a 635-nm-wavelength incident laser beam, when driven by the electrostatic comb-drive push-pull mechanism with 35 V DC bias and 70 V p-p AC voltages.

Figure 20:
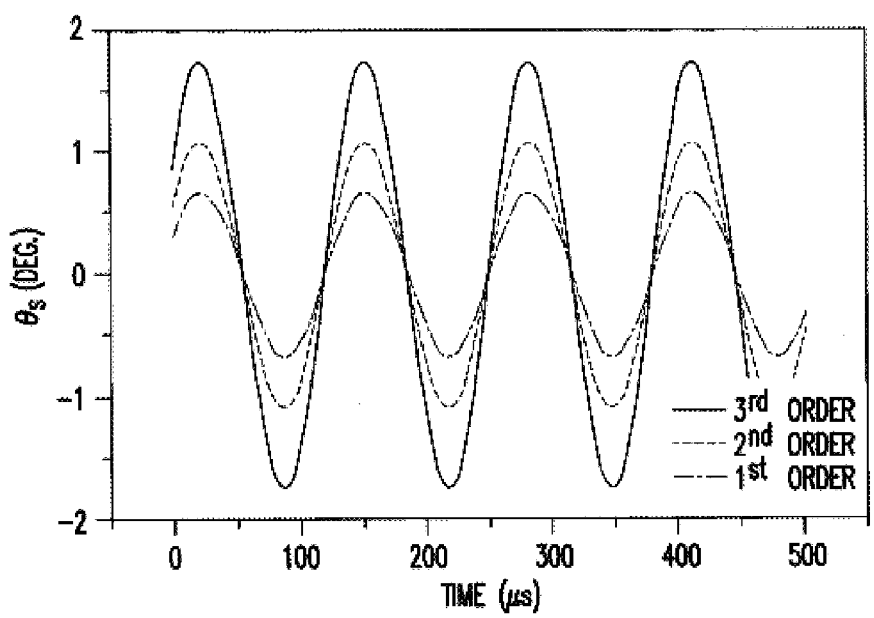
FIG. 20 shows the measured scanning angle vs. time for the fourth embodiment prototype.

FIG. 20 shows the measured scanning angle with respect to time of Mode 2 (7.67 kHz) where it is clearly observable that the laser spot measured on the PSD follows a sinusoidal motion at driving frequency and amplitude of the scanning angle. The angle of the diffracted beams from the $+1^{st}$ to the $+3^{rd}$ diffraction order are 1.31°, 2.13° and 3.42° respectively for a 635-nm-wavelength incident laser beam.

Figure 21:
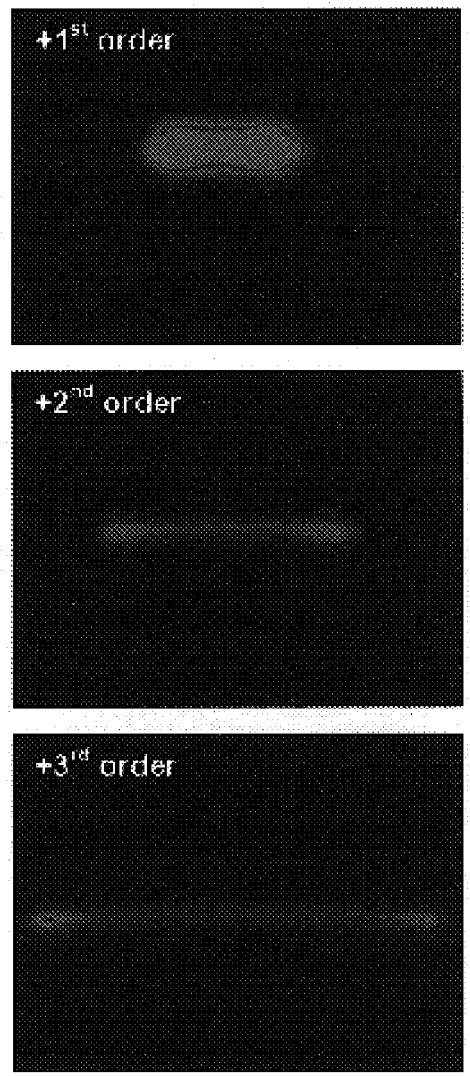
FIG. 21 shows the scan images of the fourth embodiment prototype recorded by a CCD camera.

FIG. 21 illustrates the projected scan-line images recorded by a CCD camera from the $+1^{st}$ to the $+3^{rd}$ diffraction order from Mode 3 (10.2 kHz). The grating period is limited to 4 μm by the microfabrication process used in this example. The invention, however, is not limited to this 4 μm threshold. Under the above-mentioned driving condition, the grating rotation $\theta_R$ is about 20 degrees measured by examining the "extreme positions" of the grating frame in the microscopic blurred motion-image, which means the optical scanner is capable of scanning about 28 degrees for the first diffraction order when the grating period is reduced to 450 nm.

Bulk Micromachined Prototype (Dual-Side Driving as Shown in FIG. 14)

Figure 22:
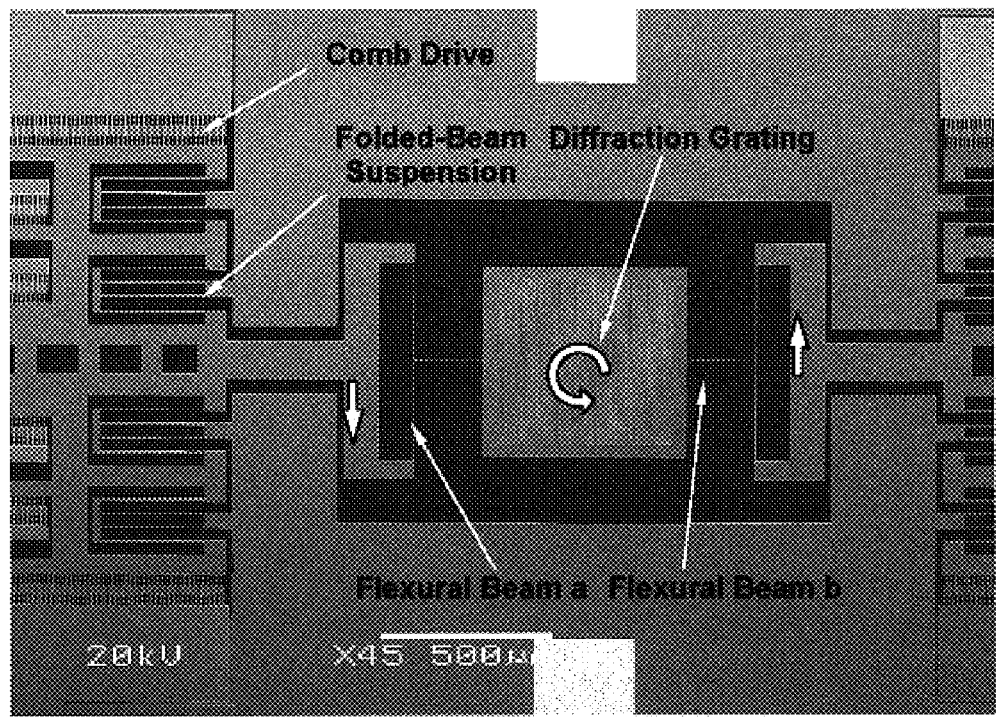
FIG. 22 shows the SEM micrograph of the physical device fabricated based on the sixth embodiment.

FIG. 22 shows the SEM image of the central part of the vibrating grating laser scanner fabricated and tested according to the sixth embodiment of the present invention shown in FIG. 14.

A schematic illustration and a SEM image of the central part of the device are shown in FIG. 22. In the inventive device, two sets of electrostatic comb drive resonators and flexural suspensions are attached symmetrically opposite to the diffraction grating. The comb drive resonators, flexural suspensions, and diffraction grating were fabricated on a doped silicon layer with a thickness of 10 μm on a silicon-on-insulator (SOI) wafer. The movable structures were released by removing the silicon dioxide underneath. The grating structure having an area of 500 μm×500 μm was composed of silicon beams of length 500 μm, width 2 μm and thickness 10 μm separated by 2 μm air gaps (through-hole openings). The flexural suspension includes two beams placed in a "T" like configuration. The flexural beam a, shown in the figure is designed as an elastic hinge to alleviate the axial stress of the flexural beam b, developed during the large angular vibration. The two set of comb-drive resonators, each having a total number of 536 movable fingers with finger length of 60 μm, width of 4 μm, finger gap of 3 μm and overlap length of 30 μm, are driven to produce translational vibrations with a phase difference of 180 degrees relative to each other. The translational vibrations of the comb-drive actuators couple through the suspension flexures to the diffraction grating causing a pure in-plane rotational vibration about the center of mass. The device was operated at atmospheric pressure and driven by push-pull mechanism with 15 V DC bias and 30 Vpp AC voltages.

Figure 23:
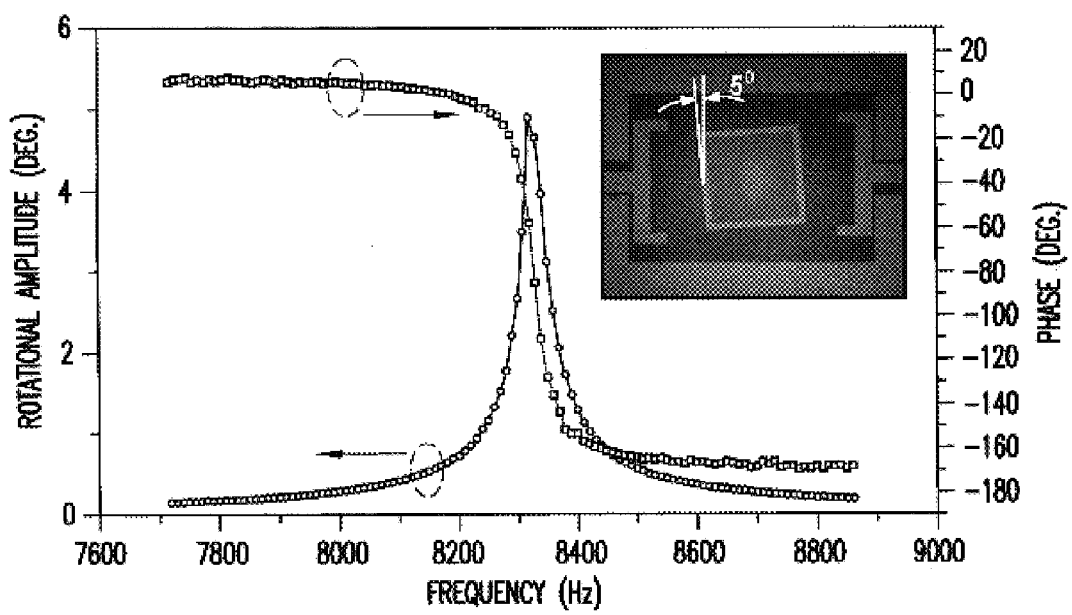
FIG. 23 shows the measured amplitude frequency response of the sixth embodiment prototype.

FIG. 23 shows the measured frequency response of the grating laser scanner. The resonant frequency and Q-factor was determined to be 8.35 kHz and ~188 respectively. The inset of FIG. 23 shows a strobed image of the diffraction grating for the maximum rotation angle of 5 degrees (10 degrees peak-to-peak). An incident laser beam from the 635 nm laser diode was then coupled into a multimode fiber with a ball-lens and collimated to the diffraction grating for the scan line experiment. It is noted that the grating period of the current prototype device was limited to 4 µm by the SOI-MUMPS design rules set by the commercial foundry. Consequently, for our prototype device with $\Lambda=4$ µm and $\lambda=635$ nm; it is not possible to obtain a bow-free scan-line for the first diffraction order, since the value of $\sin\theta_i$ in Eq. (4) will be less than −1 leading to a physically non-realizable bow-free angle of incidence $\theta_i$. However, analyzing Eqs. (1), (2) and (3), the bow-free scan-line does in fact exist for the $7^{th}$, $8^{th}$, $9^{th}$ or $10^{th}$-diffraction order provided that the angle of incidence is appropriately chosen for each of the above diffraction order. For brevity, only the scanning results for the incident angle of 46.8 degrees (bow-free condition for the $9^{th}$ diffraction order) are shown. The optical scan angle of the $9^{th}$-order as a function of time was also monitored using a position sensitive photodetector (PSD).

Figure 24:
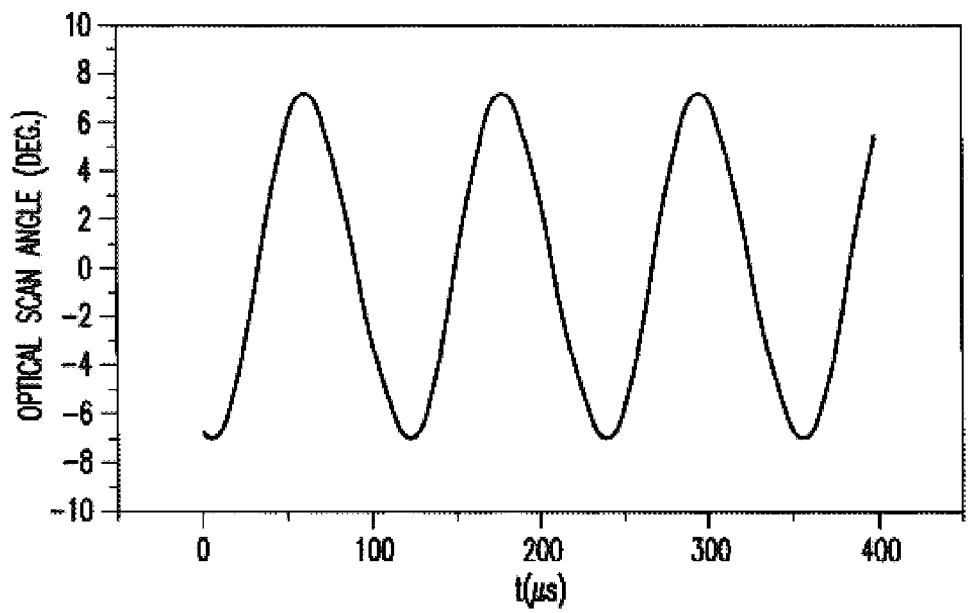
FIG. 24 shows the measured scanning angle vs. time for the sixth embodiment prototype.
Figure 25:
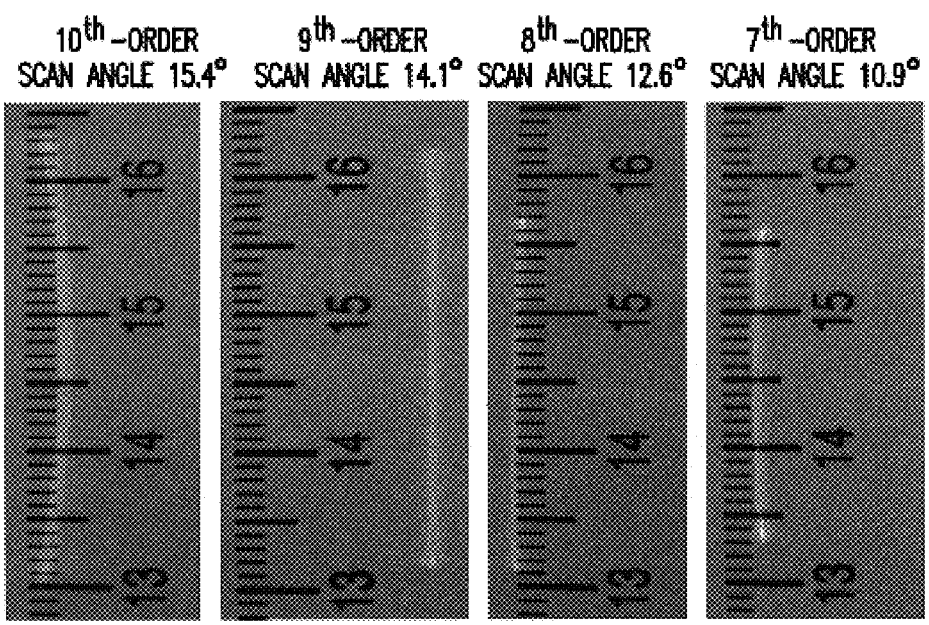
FIG. 25 shows the scan images of the sixth embodiment prototype recorded by a digital camera.

FIG. 24 shows the measurement result, where it is apparent that the laser spot on the PSD executes a single harmonic sinusoidal motion at the driving frequency. FIG. 25 shows the recorded scanning images for the $7^{th}$, $8^{th}$, $9^{th}$ and $10^{th}$-diffraction orders on a screen located at a distance of 120 mm from the grating with its normal vector parallel to the direction of the selected diffraction beam. The scanner was driven by 15 V DC bias and 30 Vpp AC voltages at its resonant frequency (8.35 kHz).

The MEM structures in the invention can also be fabricated using another modified micro- and/or nano-fabrication process based on doped/undoped Single Crystal Silicon (SCS) micromachining technology based using trench-oxide isolation method referenced to U.S. Pat. No. 5,930,595 and WO 99/36948. This process primarily allows a relatively stress-free formation of the scanner on a cheaper substrate compared to the SOI technology. It includes an innovative design of signal isolation and electrical parasitic reduction structures termed the 'busbar' that helps to provide the electrical isolation of the sensor element from the silicon substrate as well as to act as the mechanical anchor support for the free-moving scanner microstructure. The fabrication process for the scanner can be divided into two major process blocks, namely the trench-oxide isolation anchor and free-moving microstructures formation.

The process begins with a doped single crystal silicon wafer of 450-to-600 microns thickness as shown in FIG. 16. The SCS wafer is coated with a thin photoresist layer and then the grating pattern is formed using lithography method. If the period of the grating to be fabricated is less than one micron, the pattern can be formed using deep UV, e-beam lithography, two-beam interference lithography or nano-imprinting. As shown in FIG. 16, the grating pattern is transferred to the silicon wafer using RIE etching. The depth of the etching step can be controlled to maximize the diffraction efficiency of the selected diffraction order used for scanning.

Next, the SCS wafer is again coated with photoresist as shown in FIG. 16. The key feature of the remaining step is on the formation of planar island of silicon beams anchored by oxides on three sides and an air dielectric space at the bottom, leaving the fourth side exposed for forming the mechanical support connection and electrical contact to the free-moving microstructures to be formed at a later stage. The anchor is formed by firstly using the photolithography-etch-ash cycle that is common to that in IC fabrication to define an oxide hard-mask. This is followed by a dry deep-trench etch and an isotropic "feature release" etch to form the actual "fingers" of the anchor.

At this stage of fabrication, the anchor is still attached to the bulk silicon on the device side. The oxide hard-mask is removed and an "oxide-fill" process is then carried out to cement the anchor structure to the substrate. This oxide will then provide the mechanical support for the anchor when the final link to the substrate is removed during the fabrication of the interdigitated elements (fingers). The interdigitated beams are electrically isolated at the bottom due to the release-isotropic etching and also isolated at the anchors by isolation oxide. At this step, the free-moving microstructure, the platform, suspension flexures, trench-oxide isolated support structures and driving actuators are formed. Finally, the SCS wafer is patterned on the backside, and a following DRIE etching removes completely the unwanted silicon substrate.

As has been shown, the inventive technology demonstrates a MEM micromachined diffraction grating that can be in-plane actuated. The result is that the inventive diffraction gratings have a wider optical scan angle and high resonant frequencies leading to high scan frequencies. The inventive gratings have low operating voltages and produce a low dynamic deformation (less than $\lambda/8$), resulting in enhanced optical resolution.

It is to be understood that the foregoing descriptions and specific embodiments shown herein are merely illustrative of the best mode of the invention and the principles thereof, and that modifications and additions may be easily made by those skilled in the art without departing from the spirit and scope of the invention, which is therefore understood to be limited only by the scope of the appended claims.

What is claimed is:

1. An optical scanning system, comprising:
   a mass platform;
   at least one support structure connected to the mass platform though at least one flexural structure;
   at least one diffraction grating patterned on the mass platform; and
   at least one driving actuator, which drives the mass platform to vary the orientation of the grating lines through an in-plane oscillatory rotational motion of the mass platform, about a center of rotation which is fixed or variable,
   wherein said in-plane oscillatory rotational motion is combined with out-of-plane motion, that is less than 100 Hz, and that is at least one of rotational or translational motion.

2. An optical scanning system, comprising:
   mass platform;
   at least one support structure connected to the mass platform through at least one flexural structure;
   at least one diffraction grating patterned on the mass platform; and
   at least one driving actuator, which drives the mass platform to vary the orientation of the grating lines through an in-plane oscillatory rotational motion of the mass platform, about a center of rotation which is fixed or variable,
   wherein the flexural structure is a first flexural structure connected to the mass platform, and the first flexural structure transversely connects to a second flexural structure, and the second flexural structure is connected to the support structure.

3. The optical scanning system of claim 2, wherein said in-plane oscillatory rotational motion is combined with out-of-plane motion, that is less than 100 Hz, and that is at least one of rotational or translational motion.

4. The optical scanning system of claim 2, wherein the in-plane oscillatory rotational motion is combined with out-of-plane motion, that is less than 100 Hz, and that is at least one of rotational or translational motion, and the structure is used for multi-dimensional scanning.

5. The optical scanning system of claim 2, wherein the mass platform, the flexure structure and driving actuator either is or is not formed on the same substrate and their center-of-mass are not confined to lie on the same plane.

6. The optical scanning system of claim 2, wherein the diffraction grating is orientated at an angle with respect to the mass platform, wherein the angle is any angle between 0° and 180°.

7. The optical scanning system of claim 2, wherein an excitation force produced by the at least one driving actuator is applied directly to the mass platform.

8. The optical scanning system of claim 2, wherein an excitation force produced by the at least one driving actuator is applied directly to the flexural structure.

9. The optical scanning system of claim 2, wherein an excitation force produced by the at least one driving actuator is applied directly to the support structure.

10. The optical scanning system of claim 2, wherein the support structure can be fixed or movable.

11. The optical scanning system of claim 2, wherein the mass platform and the flexure structure has a geometrical shape or topology, wherein the geometrical shape or topology is symmetrical or non-symmetrical.

12. The optical scanning system of claim 2, wherein the driving actuator comprises a comb drive having an interdigitated finger structure having fixed fingers and movable fingers.

13. The optical scanning system of claim 12, wherein the movable fingers connect to the mass platform.

14. The optical scanning system of claim 12, wherein the fixed fingers comprise a fixed electrode connected to a substrate.

15. The optical scanning system of claim 12, wherein the comb drive is a circular comb drive.

16. The optical scanning system of claim 2, further comprising a folded beam suspension connected to the support structure.

17. The optical scanning system of claim 16, wherein the folded beam suspension is connected to a substrate.

18. The optical scanning system of claim 2, wherein the center of rotation is fixed at the geometric center of the mass platform.

19. The optical scanning system of claim 2, wherein the frequency of the in-plane rotation is 10 kHz or greater.

20. The optical scanning system of claim 2, wherein the center of rotation is fixed.

21. The optical scanning system of claim 2, wherein the center of rotation is variable.

22. The optical scanning system of claim 2, wherein the at least one diffraction grating is attached directly on the mass platform.

23. The optical scanning system of claim 2, wherein an angle of incidence of a light beam incident on the at least one diffraction grating with respect to its normal remains constant when the mass platform is moved exclusively in the in-plane oscillatory rotational motion.

* * * * *